United States Patent
Okada et al.

(10) Patent No.: US 11,858,147 B2
(45) Date of Patent: Jan. 2, 2024

(54) SUBSTRATE TRANSFER ROBOT AND METHOD OF DETECTING OPTICAL-AXIS DEVIATION OF SUBSTRATE HOLD HAND

(71) Applicant: KAWASAKI JUKOGYO KABUSHIKI KAISHA, Kobe (JP)

(72) Inventors: Hiroyuki Okada, Kakogawa (JP); Masaya Yoshida, Himeji (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 491 days.

(21) Appl. No.: 17/054,876

(22) PCT Filed: May 10, 2019

(86) PCT No.: PCT/JP2019/018686
§ 371 (c)(1),
(2) Date: Nov. 12, 2020

(87) PCT Pub. No.: WO2019/216401
PCT Pub. Date: Nov. 14, 2019

(65) Prior Publication Data
US 2021/0213614 A1    Jul. 15, 2021

(30) Foreign Application Priority Data
May 11, 2018  (JP) ................. 2018-092423

(51) Int. Cl.
*H01L 21/677*  (2006.01)
*H01L 21/68*  (2006.01)
(Continued)

(52) U.S. Cl.
CPC ........... *B25J 9/1692* (2013.01); *B25J 13/089* (2013.01); *B25J 19/021* (2013.01)

(58) Field of Classification Search
CPC ...... B25J 9/1692; B25J 13/089; B25J 19/021; B25J 9/1674; B25J 11/0095; B25J 13/08;
(Continued)

(56) References Cited

U.S. PATENT DOCUMENTS 6,522,952 B1 *  2/2003  Arai ................. B25J 9/1679
                                                  700/258
9,026,244 B1 *  5/2015  Mazzocco ............ G06T 7/66
                                                  700/229
(Continued)

FOREIGN PATENT DOCUMENTS

JP    2004536443 A  * 12/2004
JP    2005-118951 A    5/2005
(Continued)

*Primary Examiner* — Jonathan L Sample
*Assistant Examiner* — Byron Xavier Kasper
(74) *Attorney, Agent, or Firm* — Oliff PLC

(57) ABSTRACT

A method of detecting a substrate hold hand optical axis deviation includes: acquiring a hand reference turning position at which an ideal optical axis extends in a horizontal first direction; performing a first search processing; performing a second search processing similar to the first search processing to a second target body; and detecting an optical axis inclination from the ideal optical axis based on a difference between the positions detected in the first search processing and the second search processing. A distance in the second direction from the turning axis to the first target body is equal to a distance in the second direction from the turning axis to the second target body. On the hand, an intersecting position between the optical axis and the first target body is different from an intersecting position between the optical axis and the second target body.

11 Claims, 12 Drawing Sheets

(51) Int. Cl.
*B25J 9/16* (2006.01)
*B25J 11/00* (2006.01)
*B25J 13/08* (2006.01)
*H01L 21/67* (2006.01)
*B25J 19/02* (2006.01)

(58) Field of Classification Search
CPC . B25J 9/16; B25J 9/1664; B25J 9/1684; B25J 9/1697; G05B 2219/37283; G05B 2219/37286; H01L 21/677; H01L 21/68; H01L 21/681; H01L 21/67259; H01L 21/67742; H01L 21/67766; H01L 21/68707
See application file for complete search history.

(56) References Cited

U.S. PATENT DOCUMENTS

| | | | |
|---|---|---|---|
| 2006/0192514 A1 | 8/2006 | Adachi et al. | |
| 2014/0271083 A1* | 9/2014 | Caveney | H01L 21/67715 414/749.5 |
| 2016/0318182 A1* | 11/2016 | Nakaya | B25J 9/1697 |
| 2017/0052019 A1* | 2/2017 | Won | H01L 21/67781 |

FOREIGN PATENT DOCUMENTS

| | | | | |
|---|---|---|---|---|
| JP | 2008-114348 A | | 5/2008 | |
| JP | 2008114348 A | * | 5/2008 | |
| JP | 2008218498 A | * | 9/2008 | ....... H01L 21/67265 |
| WO | WO-2013083289 A1 | * | 6/2013 | ....... H01L 21/67259 |
| WO | WO-2015076405 A1 | * | 5/2015 | ....... H01L 21/67742 |

\* cited by examiner

SUBSTRATE TRANSFER ROBOT AND METHOD OF DETECTING OPTICAL-AXIS DEVIATION OF SUBSTRATE HOLD HAND

TECHNICAL FIELD

The present disclosure relates to an art of detecting a deviation of an optical axis of a photoelectric sensor provided to a substrate hold hand in a substrate transfer robot.

BACKGROUND ART

Conventionally, a substrate transfer robot provided with a transmission type photoelectric sensor at a tip-end part of a substrate hold hand is known. For example, the photoelectric sensor is used for detecting the existence of a substrate at each slot of a carrier by detecting an edge of the substrate accommodated in the slot.

The transmission type photoelectric sensor is provided with a light emitter and a photodetector, and they are accurately attached to the substrate hold hand. A positional deviation of an optical axis connecting the light emitter and the photodetector from an ideal position is measured by a metering device for exclusive use, is stored in a controller, and is used for controlling the robot by the controller. In recent years, a method of measuring the positional deviation of the optical axis of the photoelectric sensor from the ideal position by using the robot itself has been proposed. This kind of art is disclosed in Patent Documents 1 and 2.

Calibration methods disclosed in Patent Documents 1 and 2 include placing a teaching jig including a small circle plate at a placement position of the substrate, detecting the edge of the small circle plate by a photoelectric sensor provided to the hand to estimate the position of the teaching jig, and calculating a positional deviation of the optical axis from the ideal position in a hand axial direction, and a positional deviation of the optical axis from the ideal position in a hand rotational direction, based on a difference between the instruction position of the teaching jig and the estimated position.

REFERENCE DOCUMENTS OF CONVENTIONAL ART

Patent Documents

[Patent Document 1] JP2005-118951A
[Patent Document 2] JP2008-114348A

DESCRIPTION OF THE DISCLOSURE

Problem to be Solved by the Disclosure

In the calibration methods disclosed in Patent Documents 1 and 2, the photoelectric sensor provided to the hand detects the edge of the small circle plate while causing the hand to approach the edge of the small circle plate from different angles. Therefore, a complicated calculation is needed for obtaining the positional deviation of the optical axis from the ideal position based on the detected position.

The present disclosure is made in view of the above situation, and one purpose thereof is to propose an art for calculating a positional deviation of an optical axis from an ideal position, simply and precisely as compared with the approaches disclosed in Patent Documents 1 and 2.

Summary of the Disclosure

A method of detecting an optical-axis deviation of a substrate hold hand according to one aspect of the present disclosure is a method of detecting a deviation of an optical axis of a photoelectric sensor from an ideal optical axis defined in a hand, in a substrate transfer robot provided with the hand configured to hold a substrate, a robotic arm including a turning axis of the hand and configured to displace the hand, and the photoelectric sensor provided to a tip-end part of the hand. The method includes acquiring a reference turning position of the hand at which the turning axis is a turning center so that the ideal optical axis extends in a certain horizontal first direction, performing a series of first search processings including detecting, by the photoelectric sensor, a first target body while moving the hand in a radial direction centering on the turning axis, at a given first turning position with respect to the reference turning position and obtaining a position of the hand in a horizontal second direction perpendicular to the first direction when the first target body is detected, as a first detected position, and performing a series of second search processings including detecting, by the photoelectric sensor, a second target body while moving the hand in the radial direction centering on the turning axis, at a given second turning position with respect to the reference turning position, and obtaining a position of the hand in the second direction when the second target body is detected, as a second detected position, and detecting an inclination of the optical axis from the ideal optical axis based on a difference between the first detected position and the second detected position. A distance in the second direction from the turning axis to the first target body is equal to a distance in the second direction from the turning axis to the second target body. On the hand, an intersecting position between the optical axis and the first target body is different from an intersecting position between the optical axis and the second target body.

A method of detecting an optical-axis deviation of a substrate hold hand according to another aspect of the present disclosure is a method of detecting a deviation of an optical axis of a photoelectric sensor from an ideal optical axis defined in a hand, in a substrate transfer robot provided with the hand configured to hold a substrate, a robotic arm configured to displace the hand, and the photoelectric sensor provided to a tip-end part of the hand. The method includes moving the hand to a given substrate placement position by advancing the hand in a horizontal second direction perpendicular to a horizontal first direction in a posture in which the ideal optical axis extends in the first direction, and transferring the substrate from the hand to a substrate placing part provided to the substrate placement position, defining a position in the hand vertically overlapping with the center of the substrate held by the hand as a hand center, retreating the hand from the substrate placement position in the second direction by a distance obtained by adding a radius of the substrate to a distance between the hand center and the ideal optical axis, and obtaining a position of the hand in the second direction, as a reference position, searching, by the photoelectric sensor, for an edge of the substrate while advancing and retreating the hand in the second direction, and obtaining a position of the hand in the second direction when the edge of the substrate is detected by the search, as a detected position, and detecting a positional deviation of the optical axis from the ideal optical axis based on a difference between the reference position and the detected position.

A substrate transfer robot according to still another aspect of the present disclosure is a substrate transfer robot including a robot body, a calibration jig, and a controller. The robot body is provided with a hand configured to hold a substrate, a robotic arm including a turning axis of the hand and configured to displace the hand, and a photoelectric sensor provided to a tip-end part of the hand, an ideal optical axis being defined in the hand. The calibration jig has a first target body and a second target body. The controller includes a robot controlling module and an optical-axis inclination detecting module. The robot controlling module acquires a reference turning position of the hand at which the turning axis is a turning center so that the ideal optical axis extends in a certain horizontal first direction, and operates the robot body so that a first search is performed in which a first target body is detected by the photoelectric sensor while moving the hand in a radial direction centering on the turning axis, at a given first turning position with respect to the reference turning position, and a second search is performed in which the second target body is detected by the photoelectric sensor while moving the hand in the radial direction centering on the turning axis, at a given second turning position with respect to the reference turning position. The optical-axis inclination detecting module obtains a position of the hand in a horizontal second direction perpendicular to the first direction when the first target body is detected by the first search, as a first detected position, obtains a position of the hand in the second direction when the second target body is detected by the second search, as a second detected position, and detects an inclination of the optical axis from the ideal optical axis based on a difference between the first detected position and the second detected position. A distance in the second direction from the turning axis to the first target body is equal to a distance in the second direction from the turning axis to the second target body. On the hand, an intersecting position between the optical axis and the first target body is different from an intersecting position between the optical axis and the second target body.

A substrate transfer robot according to still another aspect of the present disclosure is a substrate transfer robot including a robot body, a substrate placing part, and a controller. The robot body is provided with a hand configured to hold a substrate, a robotic arm configured to displace the hand, and a photoelectric sensor provided to a tip-end part of the hand. The substrate placing part is provided to a given substrate placement position. The controller includes a robot controlling module and an optical-axis positional deviation detecting module. The robot controlling module defines an ideal optical axis in the hand, defines a position in the hand vertically overlapping with the center of the substrate held by the hand, as a hand center, and operates the robot body so that the hand is advanced to the substrate placement position in a horizontal second direction perpendicular to a horizontal first direction in a posture in which the ideal optical axis extends in the first direction, the substrate is transferred from the hand to the substrate placing part, the hand is moved from the substrate placement position to a position retreated in the second direction by a distance obtained by adding a radius of the substrate to a distance between the hand center and the ideal optical axis, and the photoelectric sensor searches for the edge of the substrate while advancing and retreating the hand in the second direction. The optical-axis positional deviation detecting module obtains a position of the hand in the second direction when the hand is at the retreated position, as a reference position, obtains a position of the hand in the second direction when the edge of the substrate is detected by the search, as a detected position, and detects a positional deviation of the optical axis from the ideal optical axis based on a difference between the reference position and the detected position.

Effect of the Disclosure

According to the present disclosure, the deviation of the optical axis of the substrate hold hand from an ideal position can be calculated simply and precisely as compared with the conventional approaches.

MODES FOR CARRYING OUT THE DISCLOSURE

Next, embodiments of the present disclosure are described with reference to the drawings.

Outline Configuration of Substrate Transfer Robot 1

Figure 1:
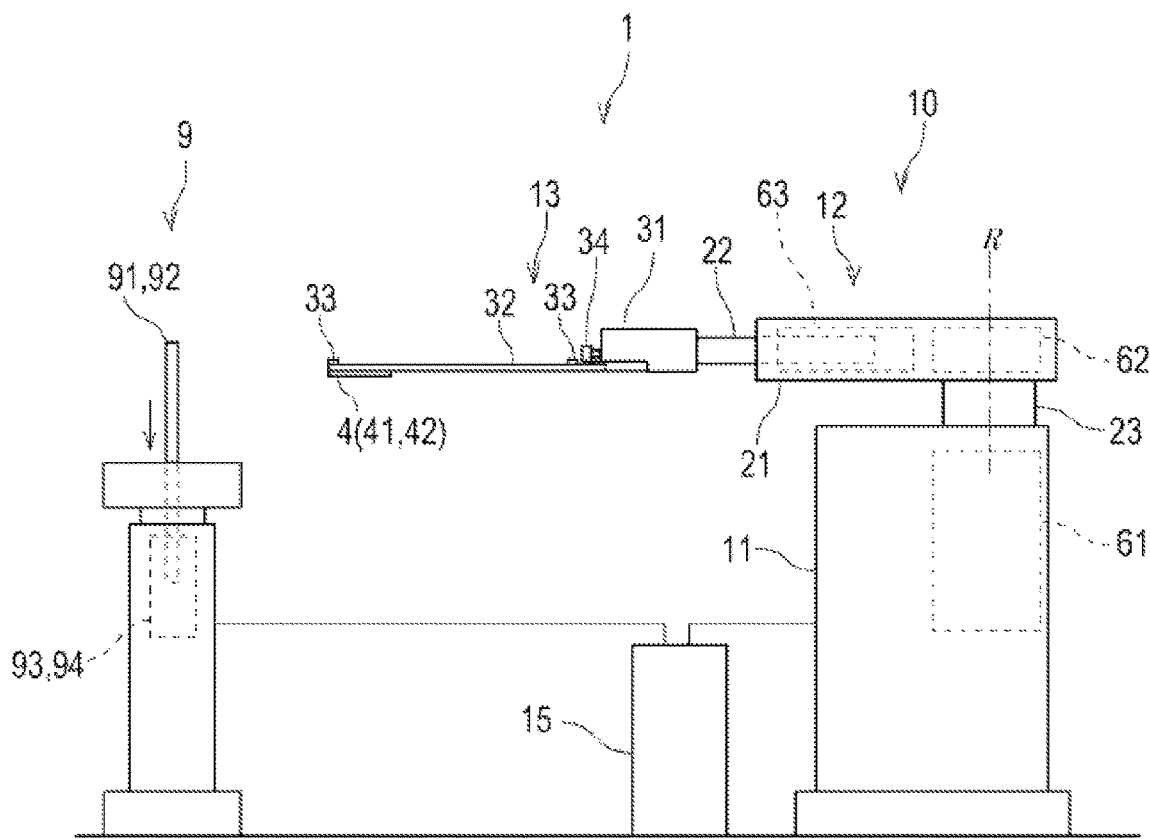
FIG. 1 is a side view schematically illustrating a substrate transfer robot according to one embodiment of the present disclosure.
Figure 2:
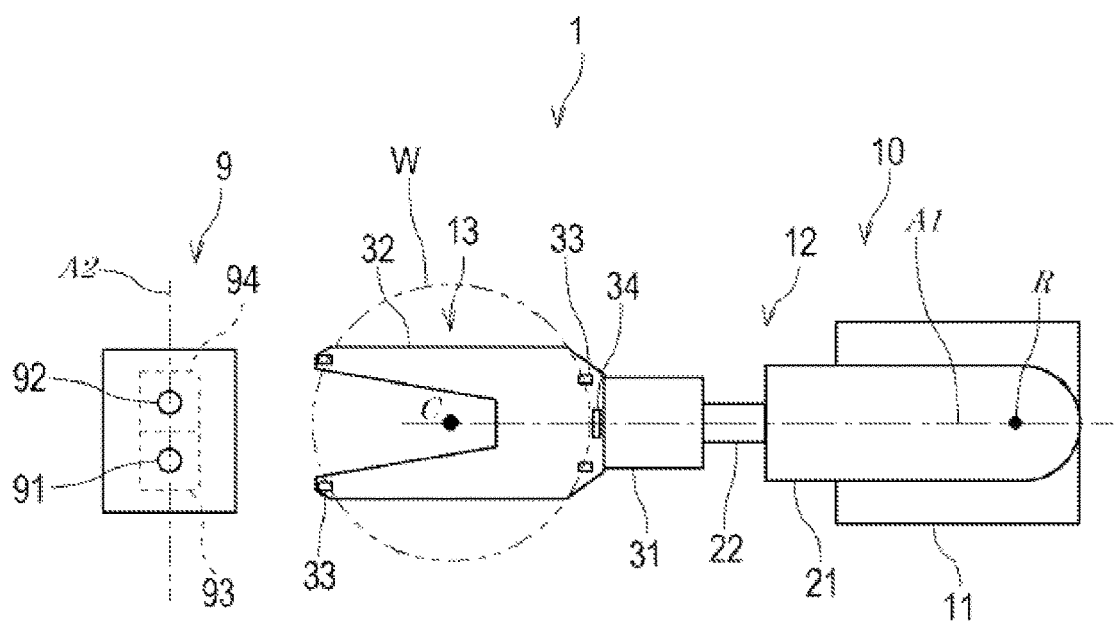
FIG. 2 is a plan view schematically illustrating the substrate transfer robot illustrated in FIG. 1.

FIG. 1 is a side view schematically illustrating a substrate transfer robot 1 according to one embodiment of the present disclosure, and FIG. 2 is a plan view schematically illustrating the substrate transfer robot 1 illustrated in FIG. 1. As illustrated in FIGS. 1 and 2, the substrate transfer robot 1 includes a robot body 10, a controller 15 which controls operation of the robot body 10, and a calibration jig 9. The substrate transfer robot 1 performs carrying a substrate W into a substrate placing part (not illustrated) (loading), and taking the substrate W out of the substrate placing part (unloading). For example, the substrate transfer robot 1 may be provided to a system which conveys or transfers various kinds of substrates W, such as an EFEM (Equipment Front End Module), a sorter, and a substrate processing system.

Configuration of Robot Body 10

The robot body 10 includes a pedestal 11, a robotic arm (hereinafter, referred to as an "arm 12") supported by the pedestal 11, a substrate hold hand (hereinafter, referred to as a "hand 13") serially provided to a distal end part of the arm 12, and a photoelectric sensor 4 of a transmission type provided to the hand 13. Note that, although the transmission type photoelectric sensor is adopted as the photoelectric sensor 4 in this embodiment, a retroreflective or regression reflective photoelectric sensor may be adopted instead of the transmission type photoelectric sensor.

The arm 12 according to this embodiment is comprised of a first link 21 extending horizontally, and a second link 22 coupled to the first link 21 through a translation joint. The first link 21 is provided with a translation device 63, and operation of the translation device 63 translates the second link 22 to the first link 21, in parallel to a longitudinal direction of the first link 21. The translation device 63 includes, for example, a linear-movement mechanism (not illustrated), such as a rail and a slide block, a rack and a pinion, balls and a screw, or a cylinder, and a servo motor M3 (see FIG. 3) as an actuator. However, the configuration of the translation device 63 is not limited to the above.

A proximal end part of the arm 12 is supported by the pedestal 11 so as to be ascendable and descendible, and turnable. Operation of a hoist unit 61 expands and contracts an elevatable shaft 23 coupled to the proximal end part of the arm 12 so that the arm 12 ascends and descends to the pedestal 11. The hoist unit 61 includes, for example, a linear-movement mechanism (not illustrated) which expands and contracts the elevatable shaft 23 from/to the pedestal 11, and a servo motor M1 (see FIG. 3) as an actuator. Moreover, operation of a turning unit 62 turns the arm 12 with respect to the pedestal 11 centering on a turning axis R. The turning axis R of the arm 12 is substantially coaxial with the axial center of the elevatable shaft 23. The turning unit 62 includes, for example, a gear mechanism (not illustrated) which rotates the first link 21 on the turning axis R, and a servo motor M2 (see FIG. 3) as an actuator. However, the configurations of the hoist unit 61 and the turning unit 62 are not limited to the above.

The hand 13 includes a base part 31 coupled to a distal end of the arm 12, and a blade 32 fixed to the base part 31. The blade 32 is a thin plate member having a Y-shape (a U-shape) where a tip-end part is divided into two.

The principal surfaces of the blade 32 are horizontal, and a plurality of support pads 33 which support the substrate W are provided on the blade 32. The plurality of support pads 33 are disposed so as to contact an edge of the substrate W placed on the blade 32. Further, a pusher 34 is provided to the hand 13 on a base-end side of the blade 32. The substrate W placed on the blade 32 is gripped between the pusher 34 and the support pad 33 disposed at the tip-end part of the blade 32.

Note that, although the hand 13 according to this embodiment conveys the substrate W while holding the substrate W in a horizontal posture, the hand 13 may hold the substrate W in a vertical posture. Moreover, although the method of holding the substrate W by the hand 13 according to this embodiment is an edge gripping type, other known methods of holding the substrate W, such as a suction type, a drop-in type, and a placement type, may also be adopted, instead of the edge gripping type.

Figure 4:
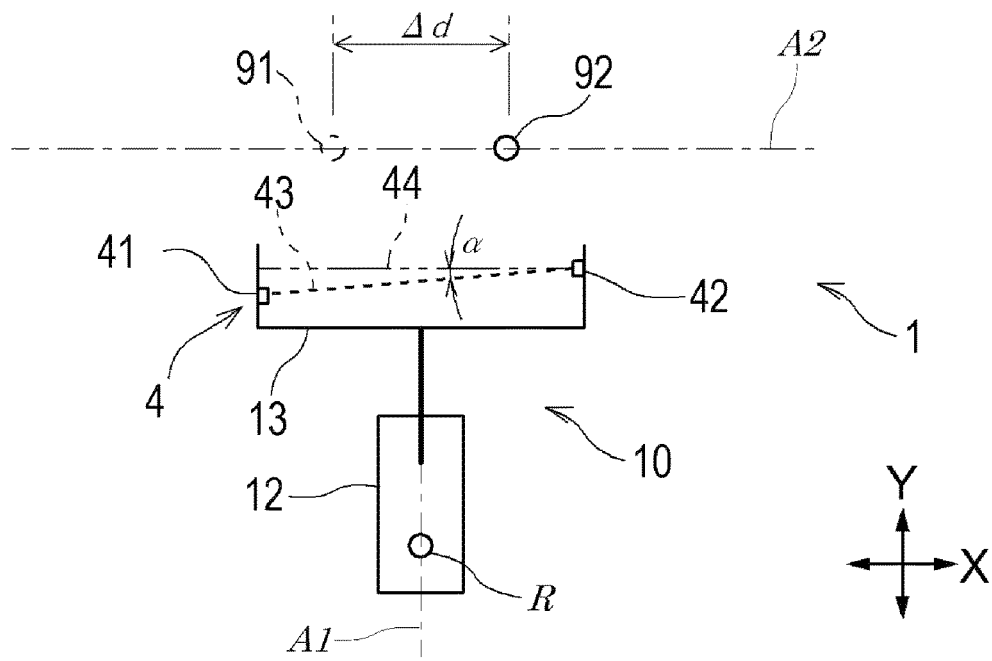
FIG. 4 is a view illustrating a method of detecting an inclination of an optical axis.

At least one set of photoelectric sensors 4 are provided to the hand 13. The photoelectric sensor 4 is provided to the back surface of the tip-end part of the blade 32, which is two-way forked. Referring to FIGS. 1 and 4, the photoelectric sensor 4 includes a light emitter 41 provided to one of the two-way forked tip-end parts of the blade 32, and a photodetector 42 provided to the other. The light emitter 41 and the photodetector 42 are separated in a direction parallel to the principal surfaces of the blade 32 (i.e., horizontal direction).

The light emitter 41 is provided with a light source which emits light which is used as a detection medium. The photodetector 42 is provided with a photodetecting element which converts the emitted light from the light emitter 41 into an electrical signal, in response to receiving the light. The light emitter 41 and the photodetector 42 are opposed to each other, and the light emitted from the light emitter 41 travels linearly and enters into a light entrance window of the photodetector 42. In FIG. 4, an optical axis 43 of the light emitted from the light emitter 41 is illustrated by a chain line. When an object passes through the optical axis 43 and the photoelectric sensor 4 detects that an amount of light which enters into the photodetector 42 decreases, the photoelectric sensor 4 outputs a detection signal to the controller 15.

Configuration of Calibration Jig 9

The calibration jig 9 according to this embodiment includes two target bodies 91 and 92, and target moving devices 93 and 94 which individually move the target bodies 91 and 92. The target bodies 91 and 92 are desirable to have a pin, a shaft, or a pillar shape extending vertically, in order to secure a window in the height to be detected by the photoelectric sensor 4 and to reduce a detected positional error. Note that the shapes of the target bodies 91 and 92 are not limited to these shapes.

The target moving devices 93 and 94 may be arbitrary devices, as long as they move the target bodies 91 and 92 between an area which can be detected by the photoelectric sensor 4 (detectable area) and an area which is lower than the detectable area and is undetectable by the photoelectric sensor 4 (undetectable area). The target moving devices 93 and 94 each includes, for example, a linear-movement mechanism, such as a rack and a pinion, and an electric motor as an actuator of the linear-movement mechanism. Note that the target moving devices 93 and 94 are not limited to this configuration. The target moving devices 93 and 94 are communicatably connected to the controller 15, and operations of the target moving devices 93 and 94 are controlled by a jig controlling module 152 of the controller 15.

In a plan view, a straight line passing through the two target bodies 91 and 92 is defined as a target reference line A2 (see FIG. 2). A clearance Δd between the two target bodies 91 and 92 parallel to the target reference line A2 is known, and is shorter than a length of the optical axis 43.

Configuration of Controller 15

Figure 3:
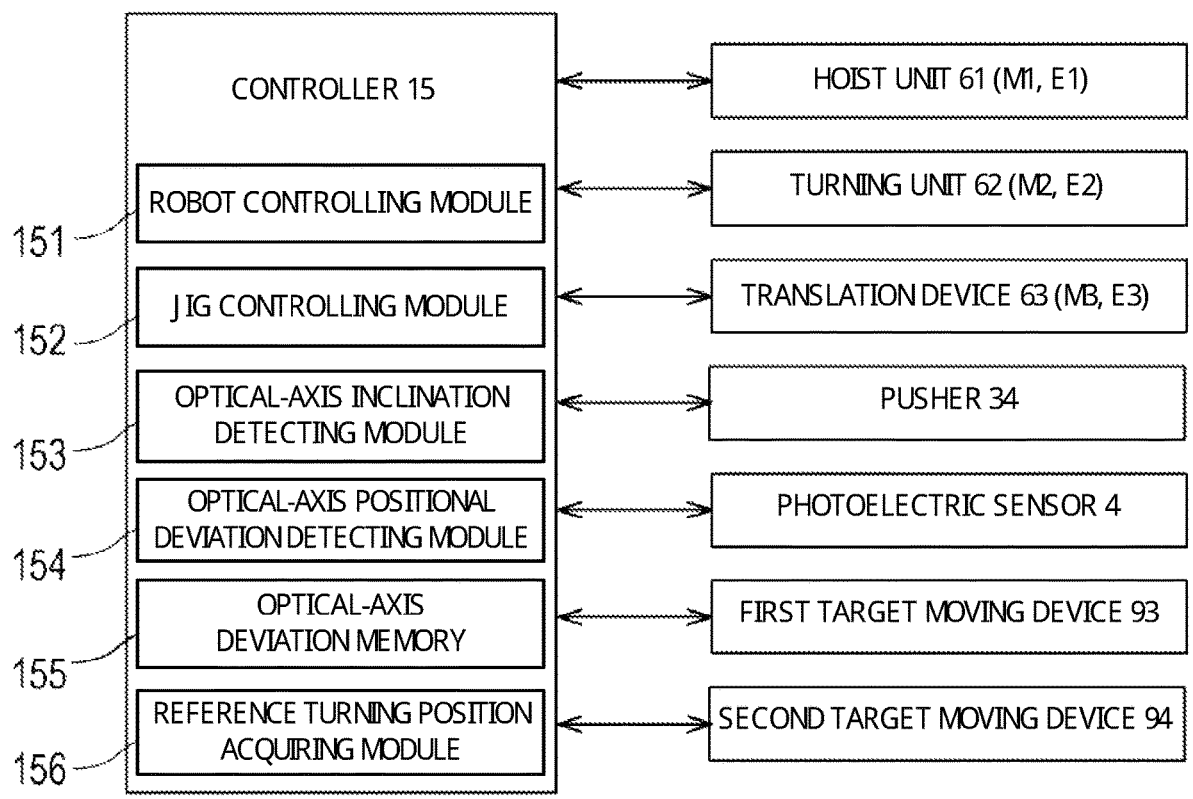
FIG. 3 is a view illustrating a configuration of a substrate transfer robot control system.

FIG. 3 is a view illustrating a configuration of a control system of the substrate transfer robot 1. The controller 15 illustrated in FIG. 3 includes functional parts, such as a robot controlling module 151 which controls operation of the robot body 10, the jig controlling module 152, an optical-axis inclination detecting module 153, an optical-axis positional deviation detecting module 154, and a reference turning position acquiring module 156. Moreover, the controller 15 has an optical-axis deviation memory 155 which stores information related to a deviation of the optical axis 43.

The controller 15 is a so-called computer, and, for example, it includes a processing unit (processor), such as a microcontroller, a CPU, an MPU, a PLC, a DSP, an ASIC, or an FPGA, and a storage device, such as a ROM and a RAM (none of them is illustrated). The storage device stores a program executed by the processing unit, various fixed data, etc. The program stored in the storage device includes a rotational-axis search program according to this embodiment. In addition, the storage device stores teaching data for controlling the operation of the arm 12, data related to the shapes and dimensions of the arm 12 and the hand 13, data related to the shape and dimension of the substrate W held by the hand 13, etc.

The controller 15 performs processing for implementing the functional parts described above by the processing unit reading and executing software, such as the program stored in the storage device. Note that the controller 15 may perform each processing by a centralized control with a sole computer, or may perform each processing by a distributed control with a collaboration of a plurality of computers.

The controller 15 is connected to the servo motor M1 for the hoist unit 61 of the arm 12, the servo motor M2 for the turning unit 62, and the servo motor M3 for the translation device 63. The servo motors M1 to M3 are provided with position transducers E1 to E3, respectively, which detect rotation angles of their output shafts, and detection signals of the position transducers E1 to E3 are outputted to the controller 15. In addition, the pusher 34 of the hand 13 is connected to the controller 15. Then, the robot controlling module 151 of the controller 15 calculates a target pose after a given control period of time based on a pose of the hand 13 identified from the rotational positions detected by the position transducers E1 to E3 (i.e., the position and the posture in the space), and the teaching data stored in the storage device, and operates the servo motors M1 to M3 so that the hand 13 becomes in the target pose after the given control period of time.

Method of Detecting Deviation of Optical Axis

Below, a method of detecting a deviation of the optical axis of the photoelectric sensor 4 provided to the hand 13, which is performed by the substrate transfer robot 1 having the above configuration, is described.

As illustrated in FIG. 2, a hand axis A1 and a hand center C are defined in the hand 13. The hand axis A1 is an axis extending linearly parallel to the longitudinal direction of the hand 13, and the blade 32 is formed in a line symmetry with respect to the hand axis A1 as a symmetry axis in the plan view. In this embodiment, the hand axis A1 is parallel to the extending and contracting direction of the arm 12, and the hand 13 moves in parallel to the hand axis A1. The hand center C is a vertical line of the hand 13 which overlaps with the center of the substrate W held by the hand 13.

The light emitter 41 and photodetector 42 of the photoelectric sensor 4 are precisely attached to the hand 13. However, the actual optical axis 43 may be deviated from a designed ideal optical axis 44 due to a mounting error and individual specificities of the light emitter 41 and the photodetector 42. The deviation of the optical axis 43 includes an inclination of the optical axis 43 from the ideal optical axis 44, and a positional deviation of the optical axis 43 from the ideal optical axis 44 in the hand axis A1 direction. Thus, in the substrate transfer robot 1 according to this embodiment, the optical-axis inclination detecting module 153 of the controller 15 detects the inclination of the optical axis 43 from the ideal optical axis 44, the optical-axis positional deviation detecting module 154 of the controller 15 detects the positional deviation of the optical axis 43 from the ideal optical axis 44 in the direction parallel to the hand axis A1, and the robot controlling module 151 operates the robot body 10 in consideration of the deviation of the optical axis 43.

Method of Detecting Inclination of Optical Axis 43

First, a method of detecting the inclination of the optical axis 43 from the ideal optical axis 44 is described. FIG. 4 is a view illustrating the method of detecting the inclination of the optical axis 43, and FIG. 5 is a flowchart of a detection processing for the inclination of the optical axis 43 by the substrate transfer robot 1.

As illustrated in FIG. 4, a certain horizontal direction is a first direction X, and a horizontal direction perpendicular to the first direction X is a second direction Y. The calibration jig 9 is positioned so that the target reference line A2 becomes parallel to the first direction X. That is, a distance between the turning axis R of the hand 13 and the first target body 91 in the second direction Y is equal to a distance between the turning axis R and the second target body 92 in the second direction Y.

Figure 5:
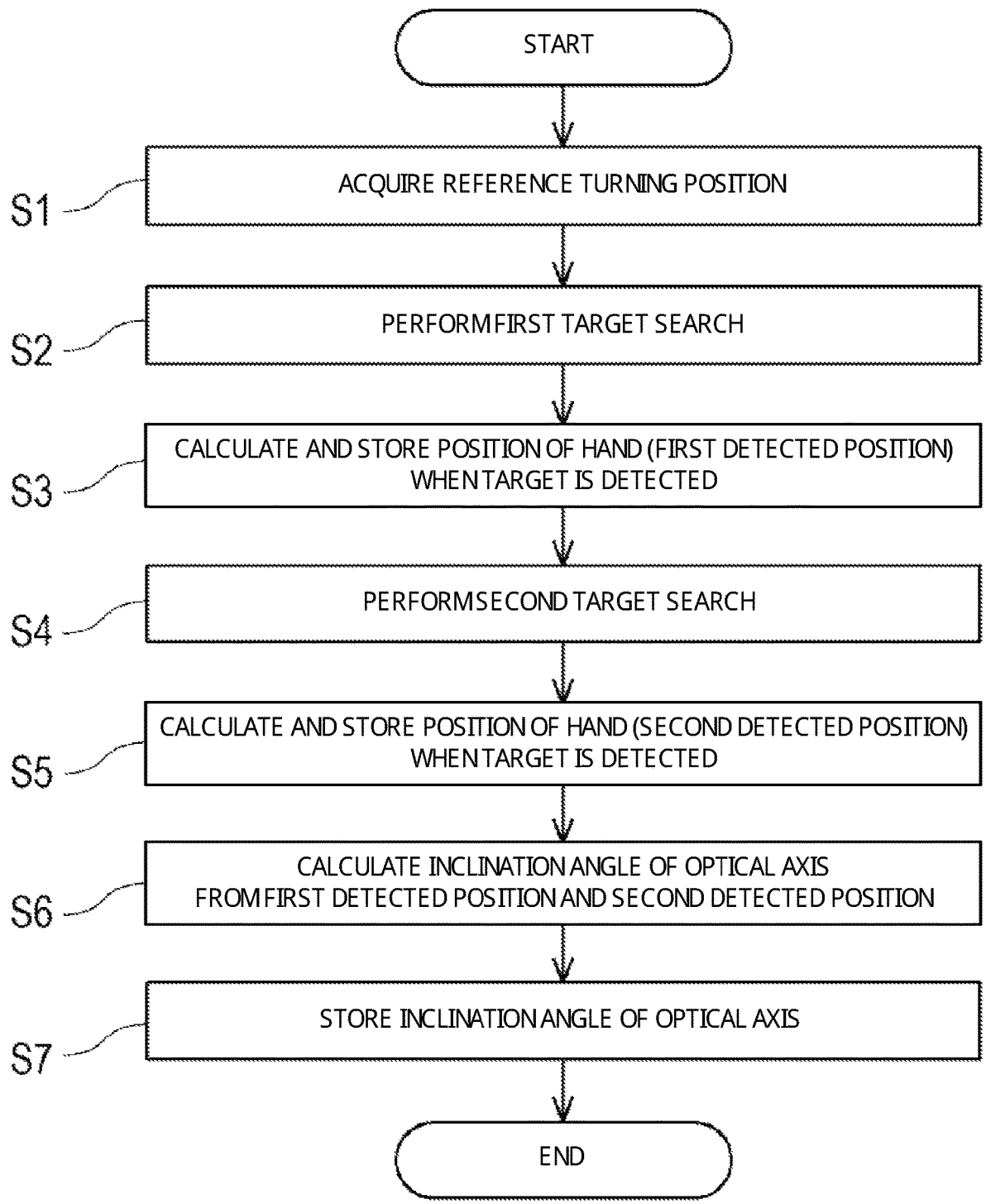
FIG. 5 is a flowchart of a detection processing for the inclination of the optical axis.

As illustrated in FIG. 5, the controller 15 first acquires a reference turning position of the hand 13 (Step S1). As illustrated in FIG. 4, the hand 13 at a given standby position is located at the reference turning position where the extending direction of the ideal optical axis 44 is the first direction X and the extending direction of the hand axis A1 is the second direction Y, and is separated from the target bodies 91 and 92 in the second direction Y. Note that, if a spatial relationship between the calibration jig 9 and the robot body 10 is known, the reference turning position of the hand 13 is known. The reference turning position acquiring module 156 acquires the reference turning position stored or taught in advance, and the robot controlling module 151 operates the robot body 10 so that the hand 13 is located at the reference turning position.

Next, the controller 15 performs a first search processing (Step S2). In the first search processing, the controller 15 operates the robot body 10 so that the hand 13 moves in the radial direction centering on the turning axis R, at the reference turning position, until the first target body 91 is detected by the photoelectric sensor 4. Here, the hand 13 moves in the second direction Y. During the first search processing, the controller 15 operates the target moving devices 93 and 94 so that the first target body 91 is located in the detectable area and the second target body 92 is located in the undetectable area.

The controller 15 calculates a position of the hand 13 in the second direction Y when the first target body 91 is detected by the first search processing, and stores it as a first detected position (Step S3). The controller 15 operates the robot body 10 so that the hand 13 moves to the standby position.

Next, the controller 15 performs a second search processing (Step S4). In the second search processing, the controller 15 operates the robot body 10 so that the hand 13 moves in the radial direction centering on the turning axis R, at the reference turning position, until the second target body 92 is detected by the photoelectric sensor 4. Here, the hand 13 moves in the second direction Y. During the second search processing, the controller 15 operates the target moving devices 93 and 94 so that the first target body 91 is located in the undetectable area and the second target body 92 is located in the detectable area.

The controller 15 calculates a position of the hand 13 in the second direction Y when the second target body 92 is detected by the second search processing, and stores it as a second detected position (Step S5). The controller 15 operates the robot body 10 so that the hand 13 moves to the standby position.

Then, the controller 15 calculates an inclination angle α of the optical axis 43 from the ideal optical axis 44 based on the first detected position and the second detected position (Step S6). A relation of the following formula can be established between the inclination angle α of the optical axis 43, a difference ΔL (not illustrated) between the first detected position and the second detected position, and the clearance Δd between the target bodies 91 and 92.

$$\tan \alpha = \Delta L / \Delta d$$

Thus, the controller 15 calculates the difference ΔL between the first detected position and the second detected position, and calculates the inclination angle α of the optical axis 43 from the ideal optical axis 44 based on the difference ΔL and the clearance Δd between the target bodies 91 and 92 by using the above formula. Here, the controller 15 may determine that there is no inclination of the optical axis 43 if the inclination angle α is substantially 0, and may determine that there is an inclination of the optical axis 43 (i.e., an inclination of the optical axis 43 is detected) if the inclination angle α is not substantially 0. Note that the phrase "substantially 0" as used herein is not limited to exactly 0, but may include a value within a given adjustable range on the plus side and the minus side of 0. The controller 15 stores the calculated inclination angle α in the optical-axis deviation memory 155 (Step S7), and then ends this processing.

Method of Detecting Positional Deviation of Optical Axis 43

Figure 6:
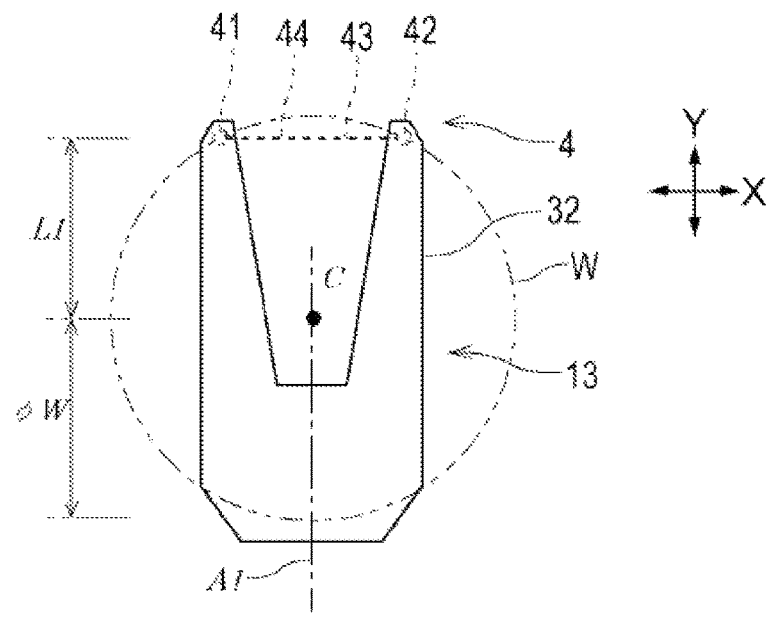
FIG. 6 is a view illustrating a method of detecting a positional deviation of the optical axis.
Figure 7:
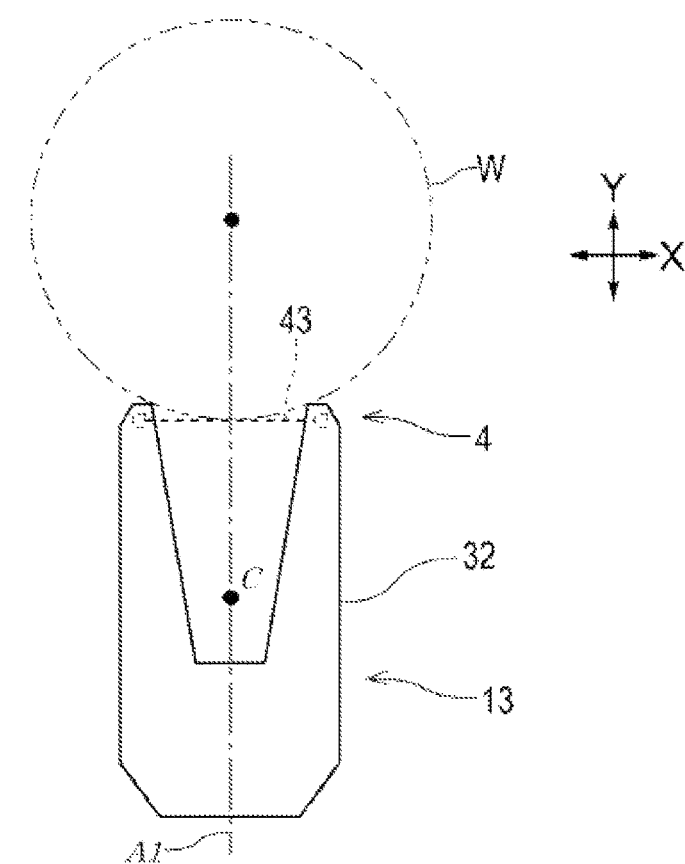
FIG. 7 is a view illustrating the method of detecting the positional deviation of the optical axis.

Then, a method of detecting the positional deviation of the optical axis 43 from the ideal optical axis 44 in the direction parallel to the hand axis A1 is described. FIGS. 6 and 7 are views illustrating the method of detecting the positional deviation of the optical axis 43, and FIG. 8 is a flowchart of a detection processing for the positional deviation of the optical axis 43 by the substrate transfer robot 1.

The hand 13 of the robot body 10 holds the substrate W, and is located at a position evacuated in the second direction Y from an arbitrary substrate placing part in a posture in which the extending direction of the ideal optical axis 44 is the first direction X and the extending direction of the hand axis A1 is the second direction Y. The substrate placing part could be anything as long as the substrate W can be placed thereon, such as a substrate boat, a substrate carrier, a substrate tray, a stage of a substrate processing device, and an aligner.

Figure 8:
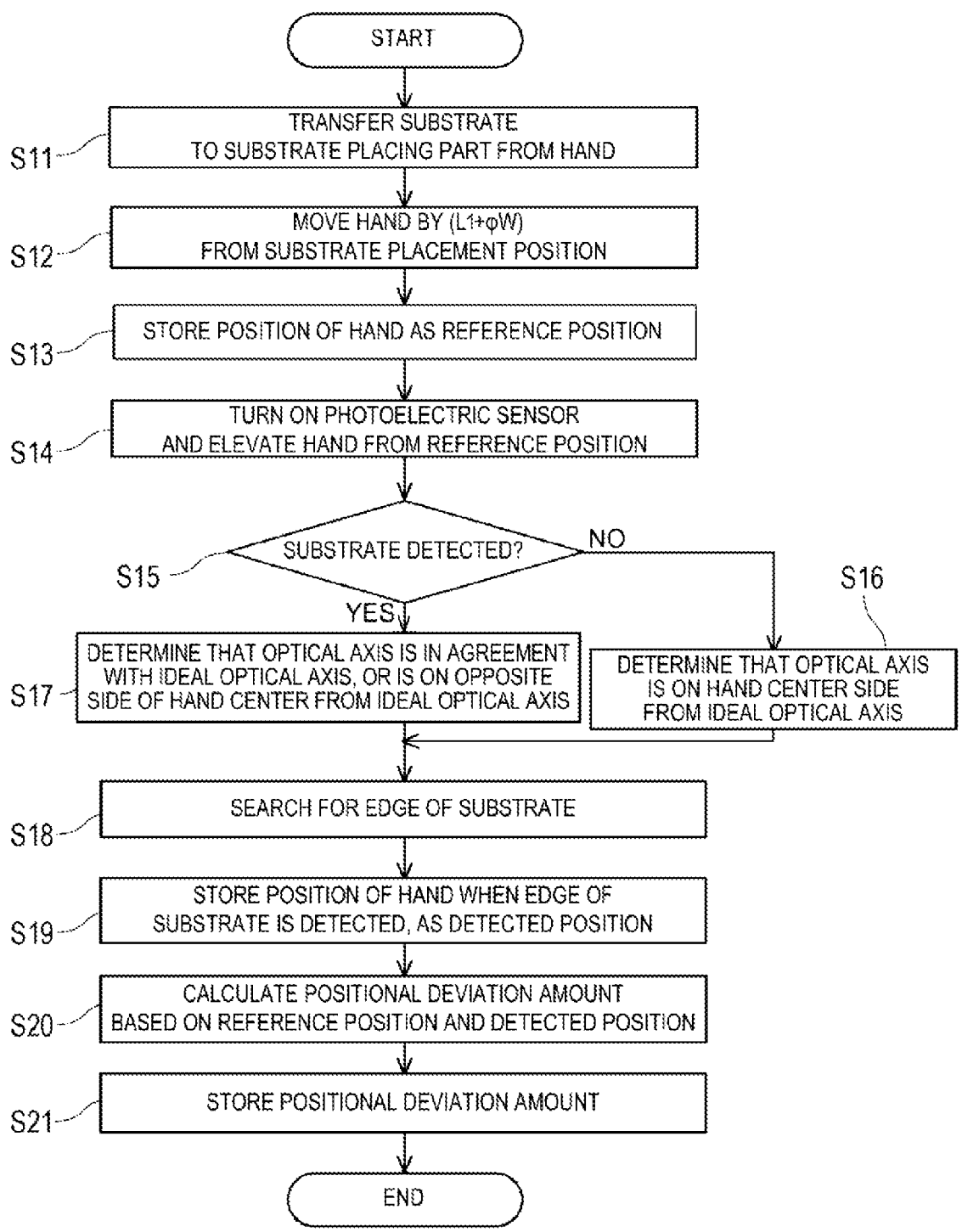
FIG. 8 is a flowchart of a detection processing for the positional deviation of the optical axis.

As illustrated in FIG. 8, the controller 15 first operates the robot body 10 so that the substrate W is transferred to the substrate placing part from the hand 13 (Step S11). Here, the controller 15 expands the arm 12 to advance the hand 13 in the second direction Y so that the blade 32 moves above the substrate placing part, and then lowers the arm 12 to move the blade 32 below the substrate placing part. Therefore, the substrate W is transferred to the substrate placing part from the hand 13. Here, the position of the hand 13 in the second direction Y when the substrate W is placed on the substrate placing part is a "substrate placement position."

As illustrated in FIG. 6, a distance L1 from the hand center C to the ideal optical axis 44 in the direction parallel to the hand axis A1 and a radius φW of the substrate W are both known values, and are stored in the controller 15 in advance. As illustrated in FIGS. 6 and 7, the controller 15 operates the robot body 10 so that the hand 13 retreats in the second direction Y by the sum of the distance L1 and the radius φW (L1+φW) from the substrate placement position (Step S12). The controller 15 stores the position of the hand 13 in the second direction Y as a reference position (Step S13).

Then, the controller 15 turns ON the photoelectric sensor 4, and operates the robot body 10 so that the hand 13 elevates from the reference position until the ideal optical axis 44 moves from below the substrate W to above the substrate W (Step S14). If the substrate W is not detected (NO at Step S15), the controller 15 determines that the optical axis 43 is deviated to the hand center C side from the ideal optical axis 44 (Step S16). If the substrate W is detected (YES at Step S15), the controller 15 determines that the optical axis 43 is in agreement with the ideal optical axis 44 or is deviated to the opposite side of the hand center C (Step S17).

The controller 15 operates the robot body 10 based on the decision results of Steps S16 and S17 so that the photoelectric sensor 4 searches for the edge of the substrate W while advancing or retreating the hand 13 in the second direction Y (Step S18). Here, if determined that the optical axis 43 is deviated to the hand center C side from the ideal optical axis 44 at Step S16, a small amount of extension of the arm 12 and the ascending and descending of the arm 12 are repeated upon searching for the edge of the substrate W, while the photoelectric sensor 4 is ON. On the other hand, if determined at Step S17 that the optical axis 43 is in agreement with the ideal optical axis 44 or is deviated to the opposite side of the hand center C, a small amount of contraction of the arm 12 and the ascending and descending of the arm 12 are repeated upon the search for the edge of the substrate W, while the photoelectric sensor 4 is ON.

The controller 15 stores, as the detected position, the position of the hand 13 in the second direction Y when the edge of the substrate W is detected (Step S19). The controller 15 calculates a difference between the reference position and the detected position as an amount of positional deviation of the optical axis 43 from the ideal optical axis 44 in the direction parallel to the hand axis A1 (Step S20). Here, the controller 15 may determine that there is no positional deviation of the optical axis 43, if the amount of positional deviation is substantially 0, and it may determine there is a positional deviation of the optical axis 43 (i.e., the positional deviation of the optical axis 43 is detected), if the amount of positional deviation is not substantially 0. The controller 15 stores the amount of positional deviation in the optical-axis deviation memory 155 (Step S21), and then ends this processing.

The controller 15 uses the inclination angle α of the optical axis 43 and the amount of positional deviation of the optical axis 43 which are stored in the optical-axis deviation memory 155, for the control of operation of the robot body 10. That is, the controller 15 generates an operating command of the robot body 10 so that the inclination angle α of the optical axis 43 and the amount of positional deviation of the optical axis 43 are calibrated.

As described above, the substrate transfer robot 1 of this embodiment includes the robot body 10 having the hand 13 which holds the substrate W, the arm 12 which includes the turning axis R of the hand 13 and displaces the hand 13, and the photoelectric sensor 4 provided to the tip-end parts of the hand 13, the calibration jig 9 having the first target body 91 and the second target body 92, and the controller 15. The calibration jig 9 according to this embodiment further includes the first target moving device 93 which moves the first target body 91 to the undetectable range of the photoelectric sensor 4 from the detectable range, and the second target moving device 94 which moves the second target body 92 to the undetectable range of the photoelectric sensor 4 from the detectable range. The first target body 91 and the second target body 92 are lined up in the first direction X, and are in the plane perpendicular to the second direction Y. Moreover, the distance between the turning axis R and the first target body 91 in the second direction Y is equal to the distance between the turning axis R and the second target body 92 in the second direction Y. The ideal optical axis 44 is defined in the hand 13.

The controller 15 includes the robot controlling module 151, the jig controlling module 152, and the optical-axis inclination detecting module 153. The robot controlling module 151 acquires the reference turning position of the hand 13 where the turning axis R is the turning center so that the ideal optical axis 44 extends in the certain horizontal first direction X, and operates the robot body 10 so that the first search is performed for detecting the first target body 91 by the photoelectric sensor 4 while moving the hand 13 in the radial direction centering on the turning axis R, at the given first turning position (in this embodiment, the reference turning position) with respect to the reference turning position, and the second search is performed for detecting the second target body 92 by the photoelectric sensor 4 while moving the hand 13 in the radial direction centering on the turning axis R, at the given second turning position (in this embodiment, the reference turning position) with respect to the reference turning position. The jig controlling module 152 operates the first target moving device 93 and the second target moving device 94 so that, during the first search, the first target body 91 is in the detectable range and the second target body 92 is in the undetectable range, and during the second search, the first target body 91 is in the undetectable range and the second target body 92 is in the detectable range. The optical-axis inclination detecting module 153 calculates, as the first detected position, the position of the hand 13 in the horizontal second direction Y perpendicular to the first direction X when the first target body 91 is detected by the first search, calculates, as the second detected position, the position of the hand 13 in the second direction Y when the second target body 92 is detected by the second search, and detects the inclination of the optical axis 43 from the ideal optical axis 44 based on the difference between the first detected position and the second detected position. In the above, on the hand 13, the intersecting position of the optical axis 43 and the first target body 91 and the intersecting position of the optical axis 43 and the second target body 92 are different.

Similarly, the method of detecting the deviation of the optical axis of the substrate hold hand according to this embodiment includes: acquiring the reference turning position of the hand 13 where the turning axis R is the turning center so that the ideal optical axis 44 extends in the certain horizontal first direction X; performing a series of first search processings including detecting, by the photoelectric sensor 4, the first target body 91, while moving the hand 13 in the radial direction centering on the turning axis R, at the given first turning position (in this embodiment, the reference turning position) with respect to the reference turning position, and calculating, as the first detected position, the position of the hand 13 in the horizontal second direction Y perpendicular to the first direction X when the first target body 91 is detected; performing a series of second search processings including detecting, by the photoelectric sensor 4, the second target body 92, while moving the hand 13 in the radial direction centering on the turning axis R, at the given second turning position (in this embodiment, the reference turning position) with respect to the reference turning position, and calculating, as the second detected position, the position of the hand 13 in the second direction Y when the second target body 92 is detected; and detecting the inclination of the optical axis 43 from the ideal optical axis 44 based on the difference between the first detected position and the second detected position. In this method of detecting the deviation of the optical-axis, the distance between the turning axis R and the first target body 91 in the second direction Y is equal to the distance between the turning axis R and the second target body 92 in the second direction Y. On the hand 13, the intersecting position of the optical axis 43 and the first target body 91 is different from the intersecting position of the optical axis 43 and the second target body 92.

According to the substrate transfer robot 1 and the method of detecting the deviation of the optical-axis, the deviation (inclination) of the optical axis 43 can be detected by using the simple calculation based on the difference between the two positions (i.e., the first detected position and the second detected position) at which the target bodies 91 and 92 are detected. In addition, since, in both the first search and the second search, the target bodies 91 and 92 are searched while moving the hand 13 in the second direction Y along with the optical axis 43, the operational error of the robot body 10 caused by a backlash etc. and the detected position errors on the target bodies 91 and 92 can be eliminated. Therefore, the deviation (inclination) of the optical axis 43 can be calculated more securely.

Moreover, in the substrate transfer robot 1 according to this embodiment, the robot controlling module 151 of the controller 15 operates the robot body 10 so that the hand 13 advances to the substrate placement position in the horizontal second direction Y perpendicular to the first direction X in the posture in which the ideal optical axis 44 extends in the first direction X, the substrate W is transferred to the substrate placing part from the hand 13, and the hand 13 is moved to the position retreated from the substrate placement position in the second direction Y by the distance obtained by adding the radius φW of the substrate W to the distance L1 between the hand center C and the ideal optical axis 44, and the photoelectric sensor 4 searches for the edge of the substrate W while advancing and retreating the hand 13 in the second direction Y. The controller 15 includes the optical-axis positional deviation detecting module 154 which calculates, as the reference position, the position of the hand 13 in the second direction Y when the hand 13 is retreated, calculates, as the detected position (third detected position), the position of the hand 13 in the second direction Y when the edge of the substrate W is detected by the search, and detects the positional deviation of the optical axis 43 from the ideal optical axis 44 based on the difference between the reference position and the detected position.

Similarly, the method of detecting the deviation of the optical axis of the substrate hold hand includes: moving the hand 13 to the given substrate placement position by advancing the hand 13 in the horizontal second direction Y perpendicular to the first direction X in the posture in which the ideal optical axis 44 extends in the horizontal first direction X to transfer the substrate W from the hand 13 to the substrate placing part provided at the substrate placement position; defining, as the hand center C, the position of the hand 13 overlapping in the vertical direction with the center of the substrate W held by the hand 13, retreating the hand 13 in the second direction Y from the substrate placement position by the distance obtained by adding the radius φW of the substrate W to the distance L1 between the hand center C and the ideal optical axis 44, and calculating as the reference position, the position of the hand 13 in the second direction Y; searching for the edge of the substrate W while advancing and retreating the hand 13 in the second direction Y, and calculating, as the detected position (third detected position), the position of the hand 13 in the second direction Y when the photoelectric sensor 4 detects the edge of the substrate W by the search; and detecting the positional deviation of the optical axis 43 from the ideal optical axis 44 based on the difference between the reference position and the detected position.

According to the substrate transfer robot 1 and the method of detecting the deviation of the optical-axis, the positional deviation of the optical axis 43 from the ideal optical axis 44 can be detected, without using a special jig.

MODIFICATION 1

Figure 9:
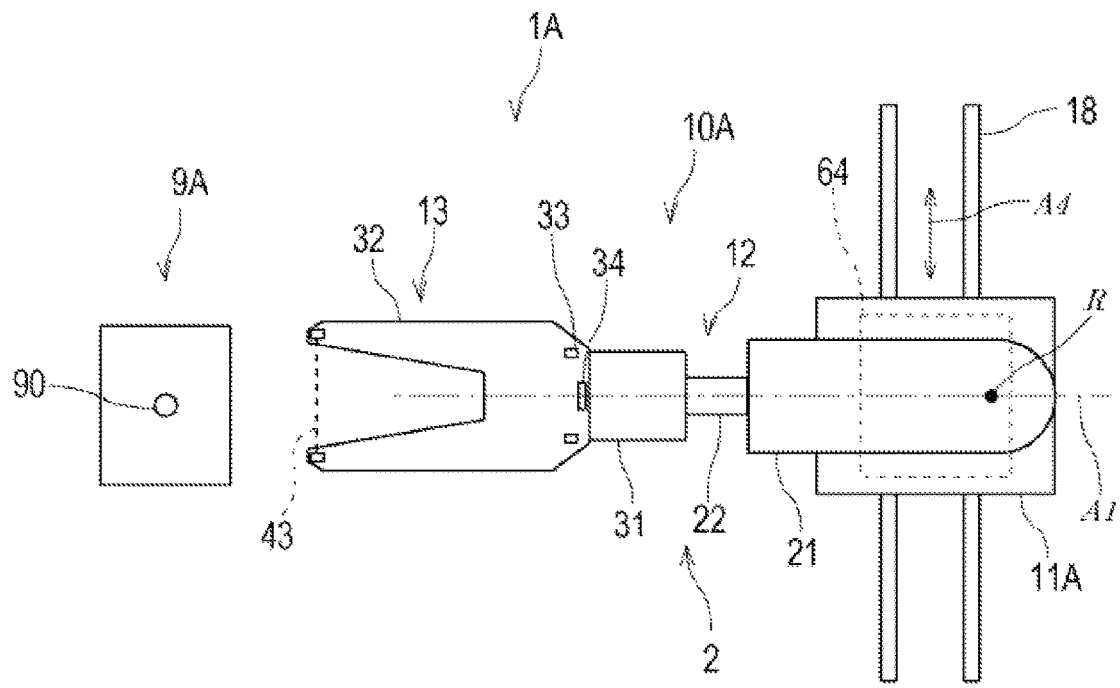
FIG. 9 is a plan view illustrating a substrate transfer robot according to Modification 1.
Figure 10:
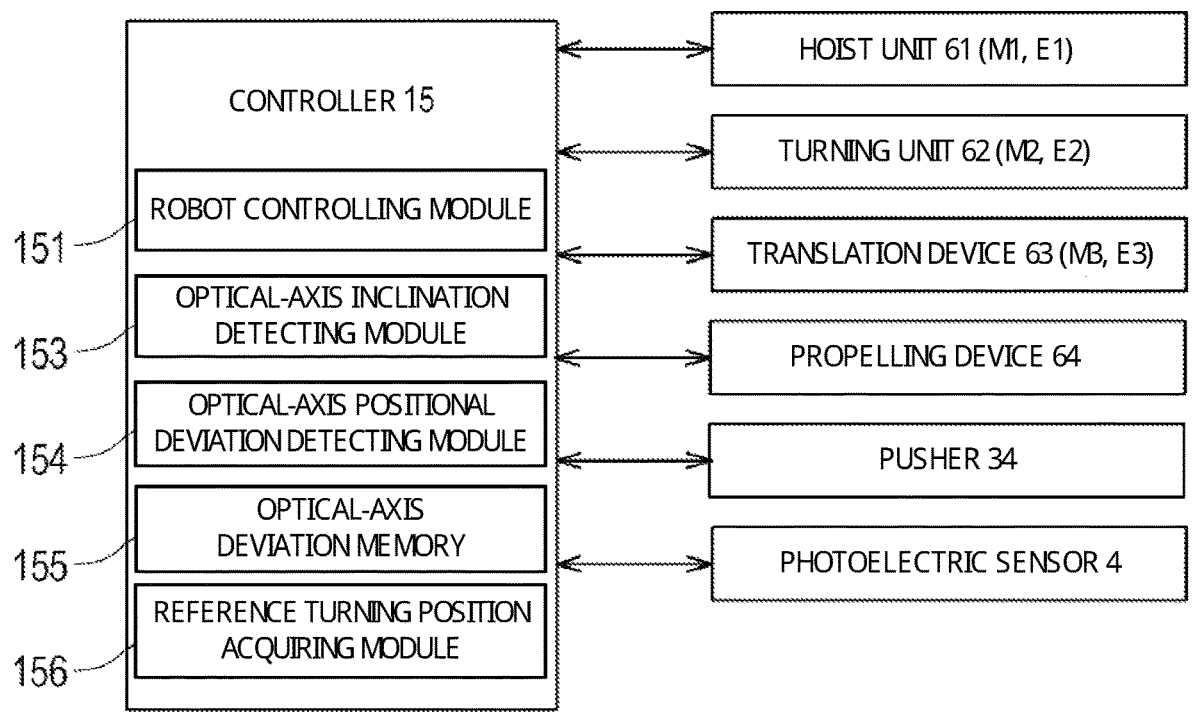
FIG. 10 is a view illustrating a configuration of a substrate transfer robot control system illustrated in FIG. 9.

Modification 1 of the above embodiment is described. A substrate transfer robot 1A according to Modification 1 is different in a configuration of a robot body 10A from the robot body 10 according to the above embodiment, and a configuration of a calibration jig 9A is also different from the calibration jig 9 according to the above embodiment. FIG. 9 is a plan view illustrating the substrate transfer robot 1A according to Modification 1, and FIG. 10 is a view illustrating a configuration of a control system of the substrate transfer robot 1A illustrated in FIG. 9. In description of Modification 1, the same reference characters are given in the drawings to members same as or similar to the above embodiment to omit description.

The robot body 10A illustrated in FIGS. 9 and 10 is different in that a carriage 11A is provided instead of the pedestal 11 as compared with the robot body 10 according to the above embodiment, and other configurations are substantially the same. The carriage 11A is provided with a propelling device 64 controlled by the controller 15, and the carriage 11A travels on rails 18 constructed on a floor by operation of the propelling device 64. The propelling device 64 includes, for example, a slide block which slides on the rails 18, a pinion which meshes with a rack provided to the rails 18, and an electric motor which rotates the pinion (none of them is illustrated). Note that the configuration of the propelling device 64 is not limited to this.

The calibration jig 9A corresponding to the robot body 10A is provided with a pin-shaped target body 90. That is, the target body 90 corresponds to a combination of the first target body 91 and the second target body 92 according to the above embodiment. Note that the target body 90 may not move like the target bodies 91 and 92.

Figure 11:
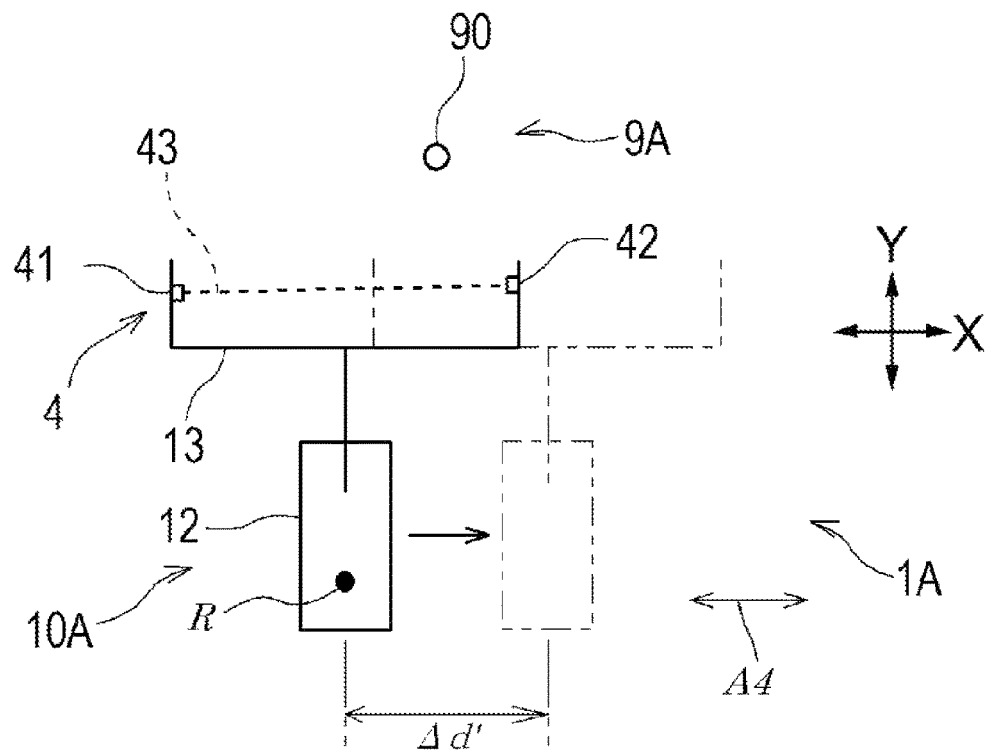
FIG. 11 is a view illustrating a method of detecting the inclination of the optical axis by the substrate transfer robot according to Modification 1.

The detection processing for the positional deviation of the optical axis 43 performed by the substrate transfer robot 1A according to Modification 1 is substantially the same as the above embodiment. The detection processing for the inclination of the optical axis 43 performed by the substrate transfer robot 1A according to Modification 1 is slightly different from the above embodiment. FIG. 11 is a view illustrating the detection processing for the inclination of the optical axis 43 by the substrate transfer robot 1A according to Modification 1.

As illustrated in FIG. 11, upon starting the detection of the inclination of the optical axis 43, the robot body 10A is positioned so that a traveling direction A4 of the carriage 11A (i.e., the extending direction of the rails 18) becomes parallel to the first direction X. The hand 13 of the robot body 10A is located at a given standby position distant from the target body 90 in the second direction Y in a posture in which the extending direction of the ideal optical axis 44 is the first direction X, and the extending direction of the hand axis A1 is the second direction Y.

Then, the controller 15 performs the processings from Steps S1 to S7 described above (see FIG. 5). Note that the concrete content of the second search processing at Step S3 and the concrete content of processing for calculating the inclination angle α of the optical axis 43 at Step S5 differ from the above embodiment.

As illustrated in FIG. 11, in the second search processing (Step S4), the controller 15 causes the propelling device 64 to move the carriage 11A by a given traveling distance Δd' in the first direction X, and causes the robot body 10A to search for the target body 90 which is the same as the first search processing.

Moreover, in the processing for calculating the inclination angle α of the optical axis 43 (Step S6), the controller 15 uses the traveling distance Δd' instead of the clearance Δd between the target bodies 91 and 92.

As described above, the substrate transfer robot 1A according to Modification 1 includes the robot body 10A having the hand 13 which holds the substrate W, the arm 12 which displaces the hand 13, and the transmission type photoelectric sensor 4 provided to the tip-end parts of the hand 13, the target body 90, and the controller 15. The ideal optical axis 44 is defined in the hand 13. The controller 15 includes the robot controlling module 151 and the optical-axis inclination detecting module 153. Similar to the above embodiment, the robot controlling module 151 acquires the reference turning position, and operates the robot body 10A so that the robot body 10A performs the first search and the second search. Note that the first turning position and the second turning position are both the reference turning position, and the robot controlling module 151 operates the robot body 10A so that the hand 13 is shifted in the first direction X after the first search, and the second search is then performed.

Moreover, the method of detecting the deviation of the optical axis of the substrate hold hand by the substrate transfer robot 1A according to Modification 1 includes, similar to the above embodiment, acquiring the reference turning position, performing the series of first search processings, performing the series of second search processings, and detecting the inclination of the optical axis 43 from the ideal optical axis 44. Note that the first turning position and the second turning position are both the reference turning position, and a locus of the hand 13 during the first search processing separates from a locus of the hand 13 during the second search processing in the first direction Y.

MODIFICATION 2

Figure 12:
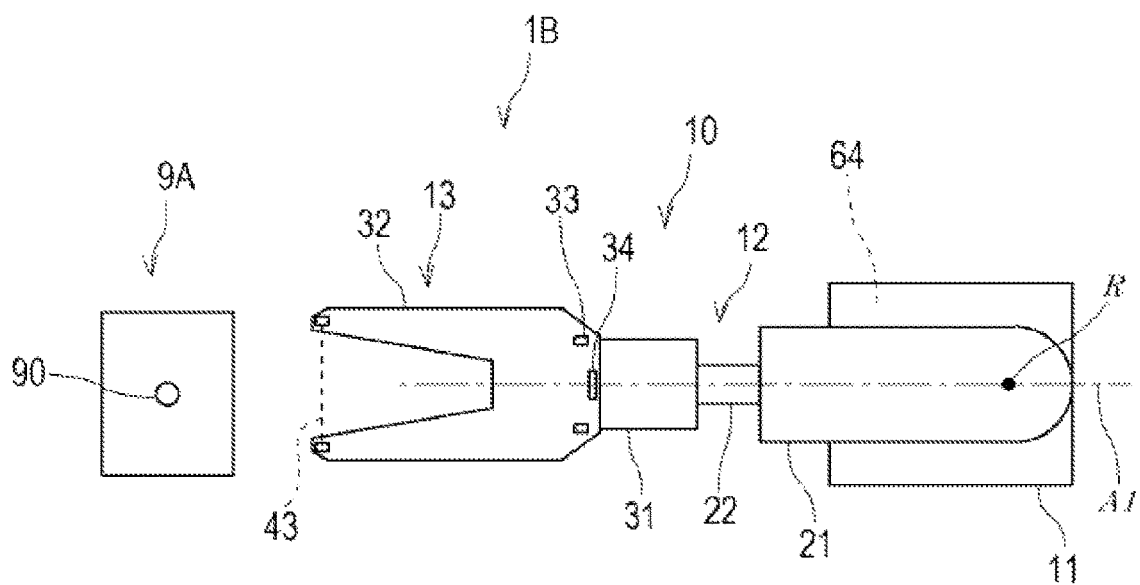
FIG. 12 is a plan view illustrating a substrate transfer robot according to Modification 2.

Modification 2 of the above embodiment is described. FIG. 12 is a plan view of a substrate transfer robot 1B according to Modification 2. In description of Modification 2, the same reference characters are given in the drawings to members same as or similar to the above embodiment to omit description.

As illustrated in FIG. 12, in the substrate transfer robot 1B according to Modification 2, the configuration of the robot body 10 is the same as that of the robot body 10 according to the above embodiment, and the configuration of the calibration jig 9A used for the detection of the inclination of the optical axis 43 is different from the calibration jig 9 according to the above embodiment. The calibration jig 9A of the substrate transfer robot 1B according to Modification 2 has substantially the same configuration as the calibration jig 9A used in Modification 1.

Figure 13:
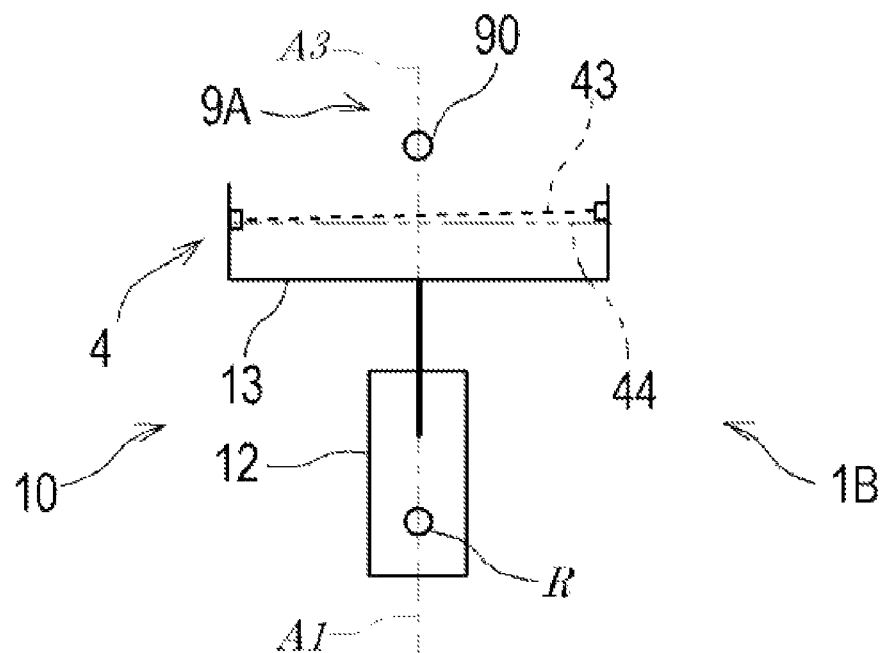
FIG. 13 is a view illustrating a detection processing for the inclination of the optical axis by the substrate transfer robot according to Modification 2.

The detection processing for the positional deviation of the optical axis 43 performed by the substrate transfer robot 1B according to Modification 2 is substantially the same as the above embodiment. The detection processing for the inclination of the optical axis 43 performed by the substrate transfer robot 1B according to Modification 2 is slightly different from the above embodiment. FIG. 13 is a view illustrating the detection processing for the inclination of the optical axis 43 by the substrate transfer robot 1B according to Modification 2.

In the detection processing for the inclination of the optical axis 43 by the controller 15, the processings of Steps S1 to S7 described above (see FIG. 5) are performed. However, the concrete content of the first search processing at Step S2, the concrete content of the second search processing at Step S4, and the concrete content of processing for calculating the inclination angle α of the optical axis 43 at Step S6 differ from the above embodiment.

As illustrated in FIG. 13, a vertical plane including the turning axis R of the hand 13 and the target body 90 extending in parallel to the turning axis R is defined as a reference vertical plane A3. Then, the position of the hand 13 at which the hand axis A1 exists in the reference vertical plane A3 (i.e., the hand axis A1 overlaps with the reference vertical plane A3 in the plan view) is used as the reference turning position. In the hand 13 located at the reference turning position, the reference vertical plane A3 is perpendicular to the ideal optical axis 44.

Figure 14:
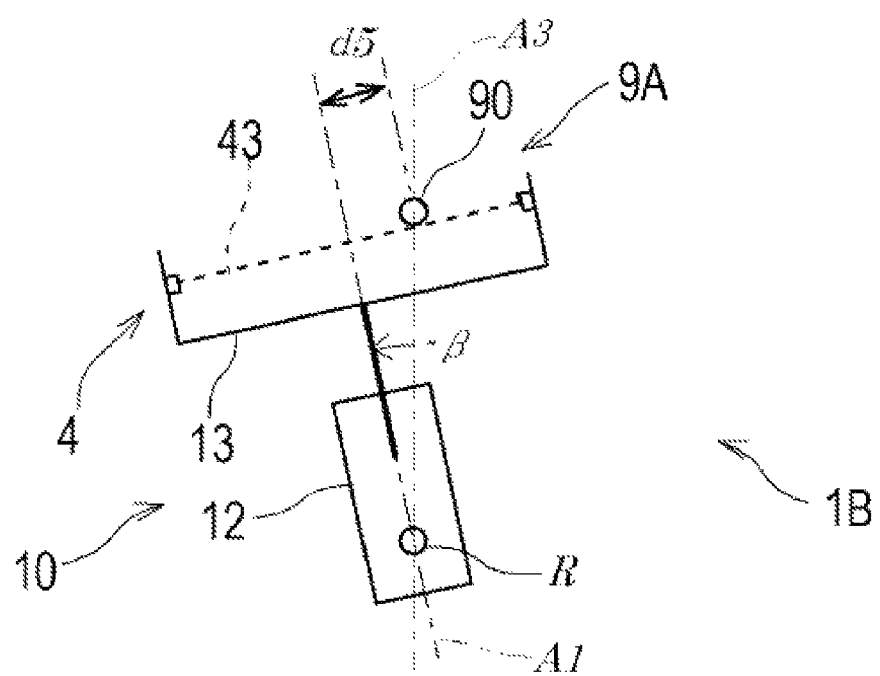
FIG. 14 is a view illustrating the detection processing for the inclination of the optical axis by the substrate transfer robot according to Modification 2.

In the first search processing (Step S2), the controller 15 first turns the arm 12 centering on the turning axis R by a minute angle (−β) from the reference turning position (see FIG. 14). Thus, the hand 13 is located at the first turning position (−β) where the reference vertical plane A3 intersects with the ideal optical axis 44, and then, by expanding and contracting the arm 12, the photoelectric sensor 4 searches for the target body 90 while moving the hand 13 in the radial direction centering on the turning axis R. Note that, when the hand 13 is located at the first detected position, a distance d5 between the hand axis A1 and the target body 90 in the plan view can be calculated based on the distance from the target body 90 to the turning axis R, the turning position, and the distance from the turning axis R to the ideal optical axis 44.

Figure 15:
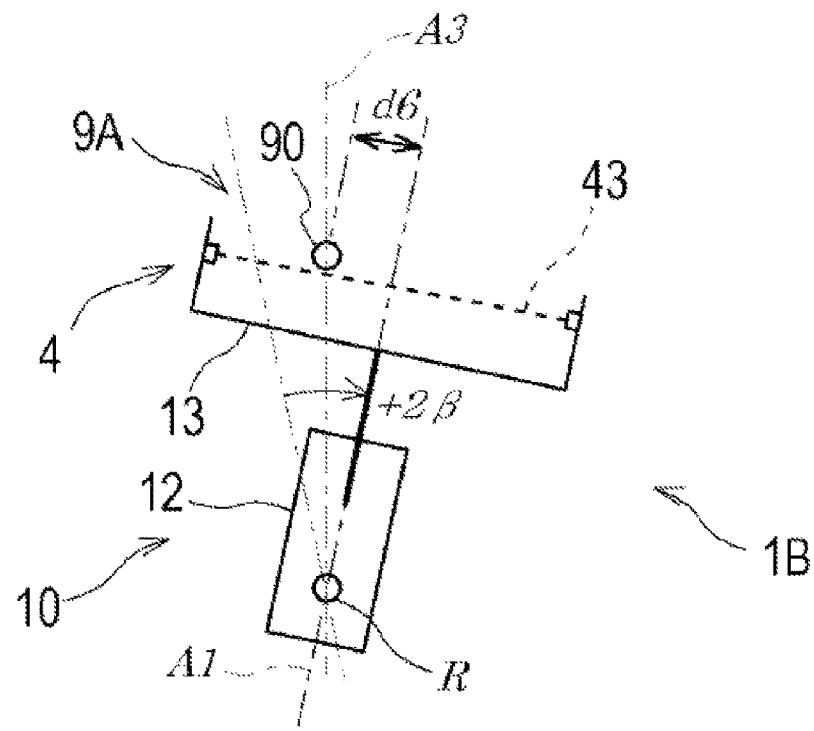
FIG. 15 is a view illustrating the detection processing for the inclination of the optical axis by the substrate transfer robot according to Modification 2.

In the second search processing (Step S4), the controller 15 first turns the arm 12 centering on the turning axis R by a given minute angle (+2β) (see FIG. 15). Thus, the hand 13 is located at the second turning position (+β) which is plane symmetrical to the first turning position (−β) with respect to the reference vertical plane A3, and then, by expanding and contracting the arm 12, the photoelectric sensor 4 searches for the target body 90 while moving the hand 13 in the radial direction centering on the turning axis R. Note that, when the hand 13 is located at the second detected position, a distance d6 between the hand axis A1 and the target body 90 in the plan view can be calculated based on the distance from the target body 90 to the turning axis R, the turning position, and the distance from the turning axis R to the ideal optical axis 44. The distance d5 and the distance d6 become ideally identical to each other.

In the processing for calculating the inclination angle α of the optical axis 43 (Step S6), the controller 15 calculates the inclination angle α of the optical axis 43 from the ideal optical axis 44 based on the sum of the distance d5 and the distance d6, and the difference between the first detected position and the second detected position.

As described above, the substrate transfer robot 1B according to Modification 2 includes the robot body 10 having the hand 13 which holds the substrate W, the arm 12 which displaces the hand 13, and the transmission type photoelectric sensor 4 provided to the tip-end parts of the hand 13, the target body 90, and the controller 15. The controller 15 includes the robot controlling module 151 and the optical-axis inclination detecting module 153. Similarly to the above embodiment, the robot controlling module 151 acquires the reference turning position, and operates the robot body 10 so as to perform the first search and the second search. Note that the first turning position is a position turned from the reference turning position by a given angle in one of the turning directions, and the second turning position is a position turned from the reference turning position by a given angle in the other turning direction.

Moreover, the method of detecting the deviation of the optical axis of the substrate hold hand by the substrate transfer robot 1B according to Modification 2 includes, similarly to the above embodiment, acquiring the reference turning position, performing the series of first search processings, performing the series of second search processings, and detecting the inclination of the optical axis 43 from the ideal optical axis 44. Note that the first turning position is a position turned from the reference turning position by a given angle in one of the turning directions, and the second turning position is a position turned from the reference turning position by a given angle in the other turning direction.

MODIFICATION 3

Modification 3 of the above embodiment is described. Although in the substrate transfer robot 1 according to the above embodiment the reference turning position which is stored or is taught in advance is used, the reference turning position may be automatically taught to the substrate transfer robot 1. Thus, in a substrate transfer robot 1C according to Modification 3, the reference turning position is automatically taught by using a calibration jig 9C which also has a function as a positioning jig for positioning the reference turning position. In description of Modification 3, the same reference characters are given in the drawings to members same as or similar to the above embodiment to omit description.

Figure 16:
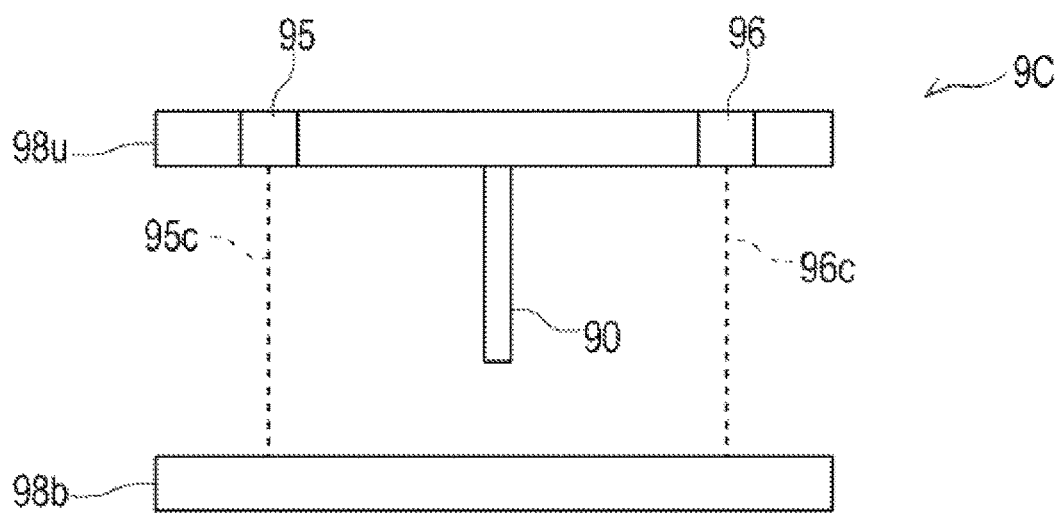
FIG. 16 is a side view illustrating a configuration of a calibration jig provided with a function as a positioning jig.

FIG. 16 is a side view illustrating a configuration of the calibration jig 9C. The calibration jig 9C illustrated in FIG. 16 includes upper and lower supporting plates 98u and 98b, the pin-like target body 90 suspended from the upper supporting plate 98u, and first and second object detection sensors 95 and 96. The upper and lower supporting plates 98u and 98b are coupled to each other through a pillar (not illustrated).

The first and second object detection sensors 95 and 96 are contactless sensors which detect an object entering between the upper supporting plate 98u and the lower supporting plate 98b. The first and second object detection sensors 95 and 96 are connected to the controller 15, and when the object is detected by these object detection sensors 95 and 96, a detection signal is transmitted to the controller 15. The first and second object detection sensors 95 and 96 may be, for example, retroreflective type photoelectric sensors. In this case, light emitting/receiving devices are provided to the upper supporting plate 98u as the first and the second object detection sensors 95 and 96, and reflectors which reflect the light emitted from the light emitting/receiving devices are provided to the lower supporting plate 98b.

The target body 90 is disposed between a first sensor axis 95c of the first object detection sensor 95 and a second sensor axis 96c of the second object detection sensor 96. In the plan view, the first sensor axis 95c of the first object detection sensor 95, the target body 90 and the second sensor axis 96c of the second object detection sensor 96 are located on one straight line A5 (see FIG. 18). The distance between the first sensor axis 95c of the first object detection sensor 95 and the target body 90 is equal to the distance between the second sensor axis 96c of the second object detection sensor 96 and the target body 90. Moreover, the clearance between the first sensor axis 95c of the first object detection sensor 95 and the second sensor axis 96c of the second object detection sensor 96 is slightly larger than a dimension of the hand 13 in a direction perpendicular to the hand axis A1 (i.e., a dimension of the hand 13 in the width direction).

Figure 17:
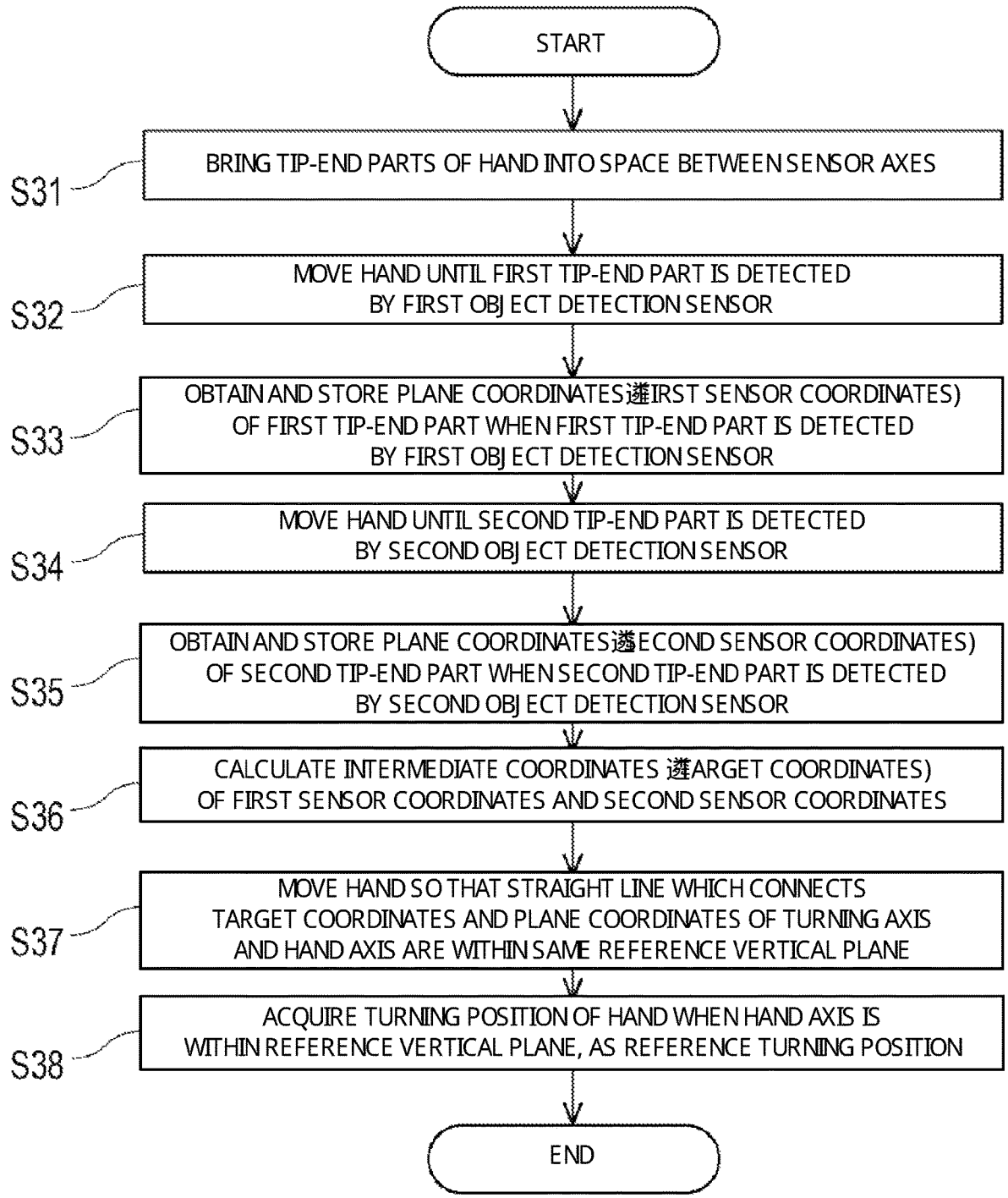
FIG. 17 is a flowchart of an automatic teach processing of a reference turning position of a substrate transfer robot according to Modification 3.
Figure 18:
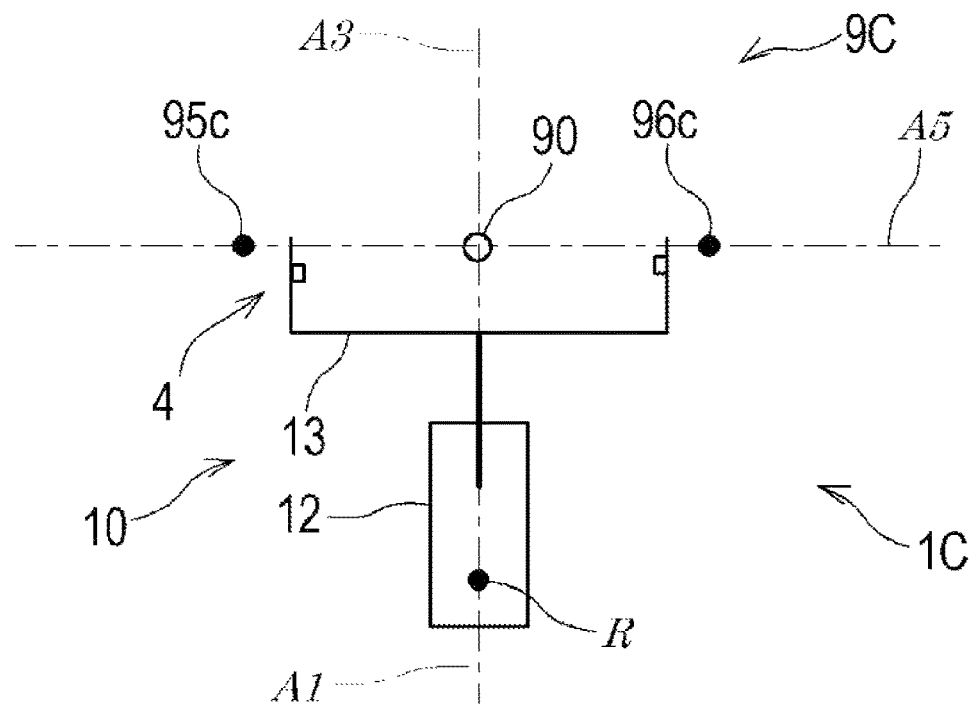
FIG. 18 is a view illustrating the automatic teach processing of the reference turning position by the substrate transfer robot according to Modification 3.
Figure 19:
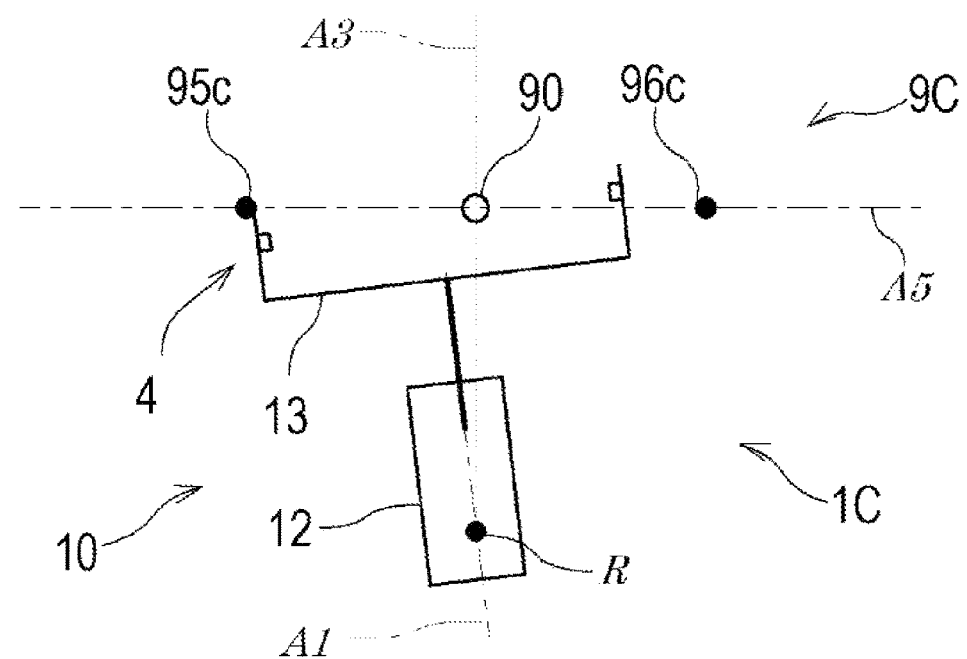
FIG. 19 is a view illustrating the automatic teach processing of the reference turning position by the substrate transfer robot according to Modification 3.
Figure 20:
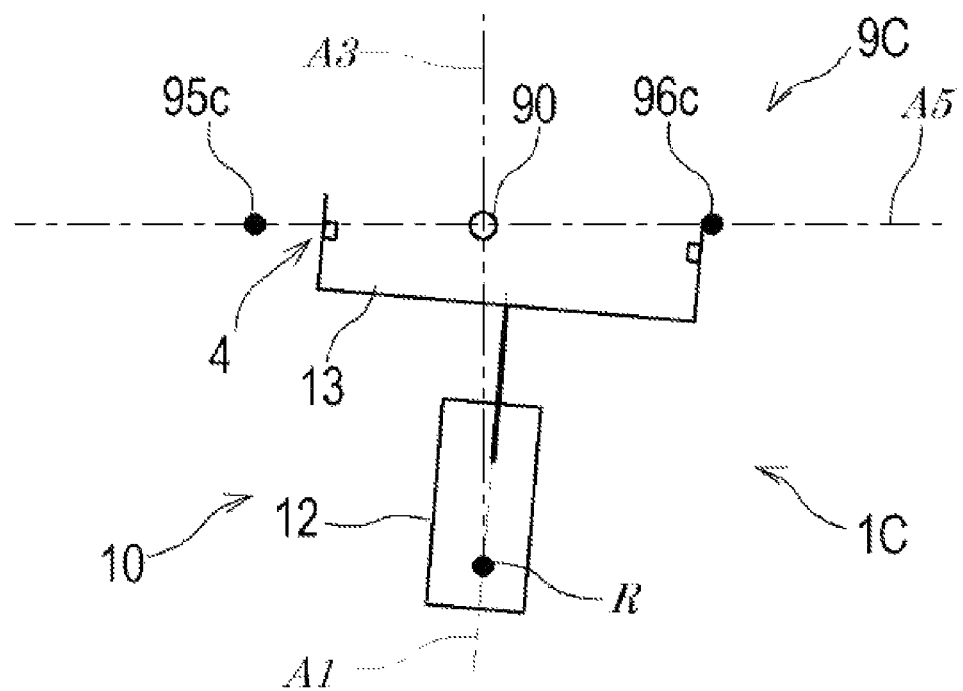
FIG. 20 is a view illustrating the automatic teach processing of the reference turning position by the substrate transfer robot according to Modification 3.

Next, a method of automatically teaching the reference turning position to the substrate transfer robot 1C by using the calibration jig 9C having the above configuration, is described. Note that the automatic teach processing of the reference turning position is mainly performed by the reference turning position acquiring module 156 of the controller 15. FIG. 17 is a flowchart of the automatic teach processing of the reference turning position of the substrate transfer robot 1C according to Modification 3. FIGS. 18 to 20 are views illustrating the automatic teach processing of the reference turning position by the substrate transfer robot 1C according to Modification 3.

As illustrated in FIG. 18, the controller 15 first brings the tip-end parts of the hand 13 into a space between the first sensor axis 95c of the first object detection sensor 95 and the second sensor axis 96c of the second object detection sensor 96 (Step S31). Here, for facilitating the description, one of the tip-end parts of the hand 13 branched into two is referred to as a "first tip-end part," and the other is referred to as a "second tip-end part." In the hand 13, the ideal optical axis 44 is defined so as to connect the first tip-end part and the second tip-end part, and the hand axis A1 perpendicular to the ideal optical axis 44 in the plane parallel to the substrate placing surface of the hand 13 is defined.

Next, as illustrated in FIG. 19, the controller 15 operates the robot body 10 so that the hand 13 moves until the first tip-end part of the hand 13 is detected by the first object detection sensor 95 (Step S32). The controller 15 obtains plane coordinates of the first tip-end part when the first tip-end part of the hand 13 is detected by the first object detection sensor 95 as first sensor coordinates, and stores it (Step S33). Note that the controller 15 can obtain the plane coordinates of the first tip-end part of the hand 13 in a robot coordinate system based on the position of the hand 13 and the known shape of the hand 13.

Next, as illustrated in FIG. 20, the controller 15 operates the robot body 10 so that the hand 13 moves until the second tip-end part of the hand 13 is detected by the second object detection sensor 96 (Step S34). The controller 15 obtains plane coordinates of the second tip-end part when the second tip-end part of the hand 13 is detected by the second object detection sensor 96 as second sensor coordinates, and stores it (Step S35). The controller 15 can obtain the plane coordinates of the second tip-end part of the hand 13 in the robot coordinate system based on the position of the hand 13 and the known shape of the hand 13.

The controller 15 calculates an intermediate position of the first sensor coordinates and the second sensor coordinates as target coordinates (Step S36). A vertical plane including a straight line which connects the target coordinates and the plane coordinates of the turning axis R is defined as the reference vertical plane A3. The controller 15 operates the robot body 10 so that the hand 13 turns to a position where the hand axis A1 is within the reference vertical plane A3 (Step S37). Then, the controller 15 acquires the turning position of the hand 13 when the hand axis A1 is within the reference vertical plane A3 as a reference turning position (Step S38).

As described above, after the reference turning position is taught to the substrate transfer robot 1C, the optical-axis deviation detection processing is performed like the above embodiment (or Modification 1 or 2). In this optical-axis deviation detection processing, the first object detection sensor 95 and the second object detection sensor 96 of the calibration jig 9C are turned OFF.

As described above, in the method of detecting the deviation of the optical axis of the substrate hold hand according to Modification 3, the acquiring the reference turning position includes bringing the first tip-end part and the second tip-end part of the hand 13 into the space between the first sensor axis 95c and the second sensor axis 96c; moving the hand 13 until the first tip-end part is detected by the first object detection sensor 95 and obtaining the plane coordinates of the first tip-end part when the first tip-end part is detected by the first object detection sensor 95 as the first sensor coordinates; moving the hand until the second tip-end part is detected by the second object detection sensor 96 and obtaining the plane coordinates of the second tip-end part when the second tip-end part is detected by the second object detection sensor 96 as the second sensor coordinates; moving the hand 13 until the straight line which connects the intermediate coordinates of the first sensor coordinates and the second sensor coordinates to the plane coordinates of the turning axis R, and the hand axis A1 enter into the same vertical plane A3; and acquiring the turning position of the hand 13 as the reference turning position.

Similarly, the substrate transfer robot 1C according to Modification 3 includes the robot body 10 having the hand 13 which holds the substrate W, the arm 12 which displaces the hand 13, and the transmission type photoelectric sensor 4 provided to the tip-end parts of the hand 13, the calibration jig 9C, and the controller 15. The calibration jig 9C has the first object detection sensor 95 and the second object detection sensor 96. The first sensor axis 95c of the first object detection sensor 95, the target body 90 (the first target body 91 or the second target body 92), and the second sensor axis 96c of the second object detection sensor 96 are lined up in this order on the same straight line at equal intervals in the plan view. The controller 15 includes the robot controlling module 151 and the reference turning position acquiring module 156. The robot controlling module 151 operates the robot body 10 so that the first tip-end part and the second tip-end part of the hand 13 enters into the space between the first sensor axis 95c and the second sensor axis 96c, the hand 13 moves until the first tip-end part is detected by the first object detection sensor 95, the hand 13 moves until the second tip-end part is detected by the second object detection sensor 96, and the hand 13 moves until the straight line which connects the target coordinates which are the plane coordinates of the first target body or the second target body to the plane coordinates of the turning axis R, and the hand axis A1 enter into the same reference vertical plane A3. The reference turning position acquiring module 156 obtains the plane coordinates of the first tip-end part when the first tip-end part of the hand 13 is detected by the first object detection sensor 95 as the first sensor coordinates, obtains the plane coordinates of the second tip-end part when the second tip-end part of the hand 13 is detected by the second object detection sensor as the second sensor coordinates, obtains the intermediate coordinates of the first sensor coordinates and the second sensor coordinates as the target coordinates, and acquires the turning position of the hand 13 when the hand axis A1 is within the reference vertical plane A3 as the reference turning position.

Although the suitable embodiments (and modifications) of the present disclosure are described above, what changed the concrete configurations and/or the details of the functions of the above embodiments without departing from the spirit of the present disclosure may be encompassed within the present disclosure.

DESCRIPTION OF REFERENCE CHARACTERS 1, 1A, 1B, 1C: Substrate Transfer Robot
4: Photoelectric Sensor
9, 9A, 9C: Calibration Jig
10: Robot Body
11: Pedestal
11A: Carriage
12: Arm
13: Hand (Substrate Hold Hand)
15: Controller
18: Rails
21: First Link
22: Second Link
23: Elevatable Shaft
31: Base Part
32: Blade
33: Support Pad
34: Pusher
41: Light Emitter
42: Photodetector
43: Optical Axis
44: Ideal Optical Axis
61: Hoist Unit
62: Turning Unit
63: Translation Device
64: Propelling Device
90, 91, 92: Target Body
93, 94: Target Moving Device
95, 96: Object Detection Sensor
98u, 98b: Supporting Plate
151: Robot Controlling Module
152: Jig Controlling Module
153: Optical-axis Inclination Detecting Module
154: Optical-axis Positional Deviation Detecting Module
155: Optical-axis Deviation Memory
156: Reference Turning Position Acquiring Module

The invention claimed is:

1. A substrate transfer robot, comprising:
a robot body comprising:
    a hand configured to hold a substrate;
    a robotic arm including a turning axis of the hand and configured to displace the hand; and
    a photoelectric sensor at a tip-end part of the hand, an ideal optical axis being defined at the hand;
a calibration jig comprising:
    a first target body;
    a first target moving device configured to move the first target body from a detectable range of the photoelectric sensor to an undetectable range;
    a second target body;
    a second target moving device configured to move the second target body from the detectable range of the photoelectric sensor to the undetectable range; and
a controller comprising a processor programmed to:
    acquire a reference turning position of the hand at which the turning axis is a turning center so that the ideal optical axis extends in a horizontal first direction;
    at a first turning position with respect to the reference turning position, operate the robot body so that a first search is performed in which the first target body is detected by the photoelectric sensor while moving the hand in a radial direction centering on the turning axis;
    at a second turning position with respect to the reference turning position, operate the robot body so that a second search is performed in which the second target body is detected by the photoelectric sensor while moving the hand in the radial direction centering on the turning axis;
    obtain, as a first detected position, a position of the hand in a horizontal second direction perpendicular to the first direction when the first target body is detected by the first search;
    obtain, as a second detected position, a position of the hand in the second direction when the second target body is detected by the second search; and
    detect an inclination of the optical axis from the ideal optical axis based on a difference between the first detected position and the second detected position, wherein:
a distance in the second direction from the turning axis to the first target body is equal to a distance in the second direction from the turning axis to the second target body;
on the hand, an intersecting position between the optical axis and the first target body is different from an intersecting position between the optical axis and the second target body;
the first target body and the second target body are lined up in the first direction; and
the processor is further programmed to operate the first target moving device and the second target moving device so that, during the first search, the first target body is in the detectable range and the second target body is in the undetectable range, and during the second search, the first target body is in the undetectable range and the second target body is in the detectable range.

2. The substrate transfer robot of claim 1,
wherein a position in the hand vertically overlapping with a center of the substrate held by the hand is defined as a hand center, and
wherein the processor is further programmed to:
operate the robot so that the hand is advanced in the second direction to a substrate placement position in a posture in which the ideal optical axis extends in the first direction, the substrate being transferred from the hand to a substrate placing part at the substrate placement position;
operate the robot so that the hand is moved from the substrate placement position to a position in the second direction retreated by a distance obtained by adding (i) a radius of the substrate to (ii) a distance between the hand center and the ideal optical axis;
operate the robot so that the photoelectric sensor searches for an edge of the substrate while advancing and retreating the hand in the second direction;
obtain a position of the hand in the second direction when the hand is at the retreated position, as a reference position;
obtain a position of the hand in the second direction when the edge of the substrate is detected by the search, as a third detected position; and
detect a positional deviation of the optical axis from the ideal optical axis based on a difference between the reference position and the third detected position.

3. The substrate transfer robot of claim 1, wherein:
the tip-end part of the hand is branched into a first tip-end part and a second tip-end part, the ideal optical axis connecting the first and second tip-end parts, and a hand axis being perpendicular to the ideal optical axis in a plane parallel to a substrate placing surface of the hand;
the calibration jig further includes a first object detection sensor and a second object detection sensor, (i) a first sensor axis of the first object detection sensor, (ii) the first target body or the second target body, and (iii) a second sensor axis of the second object detection sensor being lined up in this order at equal intervals on the same straight line in a plan view; and
the processor is further programmed to:
operate the robot body so that the first tip-end part and the second tip-end part enter between the first sensor axis and the second sensor axis;
operate the robot body so that the hand moves until the first tip-end part is detected by the first object detection sensor;
operate the robot body so that the hand moves until the second tip-end part is detected by the second object detection sensor;
operate the robot body so that the hand moves until (i) a straight line connecting target coordinates, which are plane coordinates of the first target body or the second target body, to plane coordinates of the turning axis and (ii) the hand axis enter into the same reference vertical plane;
obtain plane coordinates of the first tip-end part when the first tip-end part is detected by the first object detection sensor, as first sensor coordinates;
obtain plane coordinates of the second tip-end part when the second tip-end part is detected by the second object detection sensor, as second sensor coordinates;
obtain intermediate coordinates of the first sensor coordinates and the second sensor coordinates, as the target coordinates; and
acquire a turning position of the hand when the hand axis is within the reference vertical plane, as the reference turning position.

4. A substrate transfer robot, comprising:
a robot body comprising:
a hand configured to hold a substrate;
a robotic arm including a turning axis of the hand and configured to displace the hand; and
a photoelectric sensor at a tip-end part of the hand, an ideal optical axis being defined at the hand;
a calibration jig having a target body; and
a controller comprising a processor programmed to:
acquire a reference turning position of the hand at which the turning axis is a turning center so that the ideal optical axis extends in a horizontal first direction;
at the reference turning position, operate the robot body so that a first search is performed in which the target body is detected by the photoelectric sensor while moving the hand in a radial direction centering on the turning axis;
after the first search, operate the robot body to distance the hand from the target body in a horizontal second direction perpendicular to the first direction and to shift the hand in the first direction;
after the hand is shifted in the first direction and at the reference turning position, operate the robot body so that a second search is performed in which the target body is detected by the photoelectric sensor while moving the hand in the radial direction centering on the turning axis;
obtain, as a first detected position, a position of the hand in the horizontal second direction perpendicular to the first direction when the target body is detected by the first search;
obtain, as a second detected position, a position of the hand in the second direction when the target body is detected by the second search; and
detect an inclination of the optical axis from the ideal optical axis based on a difference between the first detected position and the second detected position,
wherein the processor of the controller is programmed to operate the robot body so that (i) the hand is at the same reference turning position for both the first search and the second search and (ii) the ideal optical axis thus extends in the same horizontal first direction for both the first search and the second search, and
wherein the hand is located at a position distanced from the target body in the second direction before each of the first and second searches.

5. The substrate transfer robot of claim 4,
wherein a position in the hand vertically overlapping with a center of the substrate held by the hand is defined as a hand center, and
wherein the processor is further programmed to:
operate the robot so that the hand is advanced in the second direction to a substrate placement position in a posture in which the ideal optical axis extends in the first direction, the substrate being transferred from the hand to a substrate placing part at the substrate placement position;

operate the robot so that the hand is moved from the substrate placement position to a position in the second direction retreated by a distance obtained by adding (i) a radius of the substrate to (ii) a distance between the hand center and the ideal optical axis;

operate the robot so that the photoelectric sensor searches for an edge of the substrate while advancing and retreating the hand in the second direction;

obtain a position of the hand in the second direction when the hand is at the retreated position, as a reference position;

obtain a position of the hand in the second direction when the edge of the substrate is detected by the search, as a third detected position; and detect a positional deviation of the optical axis from the ideal optical axis based on a difference between the reference position and the third detected position.

6. The substrate transfer robot of claim 4, wherein:

the tip-end part of the hand is branched into a first tip-end part and a second tip-end part, the ideal optical axis connecting the first and second tip-end parts, and a hand axis being perpendicular to the ideal optical axis in a plane parallel to a substrate placing surface of the hand;

the calibration jig further includes a first object detection sensor and a second object detection sensor, (i) a first sensor axis of the first object detection sensor, (ii) the target body, and (iii) a second sensor axis of the second object detection sensor being lined up in this order at equal intervals on the same straight line in a plan view; and the processor is further programmed to:

operate the robot body so that the first tip-end part and the second tip-end part enter between the first sensor axis and the second sensor axis;

operate the robot body so that the hand moves until the first tip-end part is detected by the first object detection sensor;

operate the robot body so that the hand moves until the second tip-end part is detected by the second object detection sensor;

operate the robot body so that the hand moves until (i) a straight line connecting target coordinates, which are plane coordinates of the target body, to plane coordinates of the turning axis and (ii) the hand axis enter into the same reference vertical plane;

obtain plane coordinates of the first tip-end part when the first tip-end part is detected by the first object detection sensor, as first sensor coordinates;

obtain plane coordinates of the second tip-end part when the second tip-end part is detected by the second object detection sensor, as second sensor coordinates;

obtain intermediate coordinates of the first sensor coordinates and the second sensor coordinates, as the target coordinates; and acquire a turning position of the hand when the hand axis is within the reference vertical plane, as the reference turning position.

7. A substrate transfer robot, comprising:

a robot body comprising:

a hand configured to hold a substrate;

a robotic arm including a turning axis of the hand and configured to displace the hand; and a photoelectric sensor at a tip-end part of the hand, an ideal optical axis being defined at the hand;

a calibration jig having a target body; and a controller comprising a processor programmed to:

acquire a reference turning position of the hand at which the turning axis is a turning center so that the ideal optical axis extends in a horizontal first direction;

at a first turning position with respect to the reference turning position, operate the robot body so that a first search is performed in which the target body is detected by the photoelectric sensor while moving the hand in a radial direction centering on the turning axis;

at a second turning position with respect to the reference turning position, operate the robot body so that a second search is performed in which the target body is detected by the photoelectric sensor while moving the hand in the radial direction centering on the turning axis;

obtain, as a first detected position, a position of the hand in a horizontal second direction perpendicular to the first direction when the target body is detected by the first search;

obtain, as a second detected position, a position of the hand in the second direction when the target body is detected by the second search; and detect an inclination of the optical axis from the ideal optical axis based on a difference between the first detected position and the second detected position, wherein the first turning position is a position turned from the reference turning position by a first angle in one of turning directions, and the second turning position is a position turned from the reference turning position by a second angle in the other turning direction, the first angle being equal to the second angle.

8. The substrate transfer robot of claim 7, wherein a position in the hand vertically overlapping with a center of the substrate held by the hand is defined as a hand center, and wherein the processor is further programmed to:

operate the robot so that the hand is advanced in the second direction to a substrate placement position in a posture in which the ideal optical axis extends in the first direction, the substrate being transferred from the hand to a substrate placing part at the substrate placement position;

operate the robot so that the hand moves from the substrate placement position to a position in the second direction retreated by a distance obtained by adding (i) a radius of the substrate to (ii) a distance between the hand center and the ideal optical axis;

operate the robot so that the photoelectric sensor searches for an edge of the substrate while advancing and retreating the hand in the second direction;

obtain a position of the hand in the second direction when the hand is at the retreated position, as a reference position;

obtain a position of the hand in the second direction when the edge of the substrate is detected by the search, as a third detected position; and detect a positional deviation of the optical axis from the ideal optical axis based on a difference between the reference position and the third detected position.

9. The substrate transfer robot of claim 7, wherein:

the tip-end part of the hand is branched into a first tip-end part and a second tip-end part, the ideal optical axis connecting the first and second tip-end parts, and a hand axis being perpendicular to the ideal optical axis in a plane parallel to a substrate placing surface of the hand;

the calibration jig further includes a first object detection sensor and a second object detection sensor, (i) a first sensor axis of the first object detection sensor, (ii) the target body, and (iii) a second sensor axis of the second object detection sensor being lined up in this order at equal intervals on the same straight line in a plan view; and the processor is further programmed to:
  operate the robot body so that the first tip-end part and the second tip-end part enter between the first sensor axis and the second sensor axis;
  operate the robot body so that the hand moves until the first tip-end part is detected by the first object detection sensor;
  operate the robot body so that the hand moves until the second tip-end part is detected by the second object detection sensor;
  operate the robot body so that the hand moves until (i) a straight line connecting target coordinates, which are plane coordinates of the first target body, to plane coordinates of the turning axis and (ii) the hand axis enter into the same reference vertical plane;
  obtain plane coordinates of the first tip-end part when the first tip-end part is detected by the first object detection sensor, as first sensor coordinates;
  obtain plane coordinates of the second tip-end part when the second tip-end part is detected by the second object detection sensor, as second sensor coordinates;
  obtain intermediate coordinates of the first sensor coordinates and the second sensor coordinates, as the target coordinates; and
  acquire a turning position of the hand when the hand axis is within the reference vertical plane, as the reference turning position.

10. A substrate transfer robot, comprising:
a robot body comprising:
  a hand configured to hold a substrate;
  a robotic arm configured to displace the hand; and
  a photoelectric sensor at a tip-end part of the hand;
a substrate placing part at a substrate placement position; and
a controller comprising a processor programmed to:
  define an ideal optical axis in the hand;
  define a position in the hand vertically overlapping with a center of the substrate held by the hand, as a hand center;
  operate the robot body so that the hand is advanced to the substrate placement position in a horizontal second direction perpendicular to a horizontal first direction in a posture in which the ideal optical axis extends in the first direction, the substrate being transferred from the hand to the substrate placing part at the substrate placement position;
  operate the robot body so that the hand is moved from the substrate placement position to a position retreated in the second direction by a distance obtained by adding (i) a radius of the substrate to (ii) a distance between the hand center and the ideal optical axis;
  operate the robot body so that the photoelectric sensor performs a first search for an edge of the substrate while advancing and retreating the hand in the second direction;
  obtain a position of the hand in the second direction when the hand is at the retreated position, as a reference position;
  obtain a position of the hand in the second direction when the edge of the substrate is detected by the first search, as a first detected position; and
  detect a positional deviation of the optical axis from the ideal optical axis based on a difference between the reference position and the first detected position.

11. The substrate transfer robot of claim 10, wherein:
the robot body further comprises a calibration jig having a target body;
the robotic arm of the robot body includes a turning axis of the hand;
the processor of the controller is further programmed to:
  acquire a reference turning position of the hand at which the turning axis is a turning center so that the ideal optical axis extends in the horizontal first direction;
  at a first turning position with respect to the reference turning position, operate the robot body so that a second search is performed in which the target body is detected by the photoelectric sensor while moving the hand in a radial direction centering on the turning axis;
  at a second turning position with respect to the reference turning position, operate the robot body so that a third search is performed in which the target body is detected by the photoelectric sensor while moving the hand in the radial direction centering on the turning axis;
  obtain, as a second detected position, a position of the hand in the horizontal second direction perpendicular to the first direction when the target body is detected by the second search;
  obtain, as a third detected position, a position of the hand in the second direction when the target body is detected by the third search; and
  detect an inclination of the optical axis from the ideal optical axis based on a difference between the second detected position and the third detected position; and
the first turning position is a position turned from the reference turning position by a first angle in one of turning directions, and the second turning position is a position turned from the reference turning position by a second angle in the other turning direction, the first angle being equal to the second angle.

* * * * *